United States Patent
Muraki

(10) Patent No.: US 6,552,353 B1
(45) Date of Patent: Apr. 22, 2003

(54) MULTI-ELECTRON BEAM EXPOSURE METHOD AND APPARATUS AND DEVICE MANUFACTURING METHOD

(75) Inventor: Masato Muraki, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/217,941

(22) Filed: Dec. 22, 1998

(30) Foreign Application Priority Data

Jan. 5, 1998 (JP) .......................................... 10-000202
Jan. 5, 1998 (JP) .......................................... 10-000203

(51) Int. Cl.$^7$ ............................................... H01J 37/04
(52) U.S. Cl. ............................. 250/492.2; 250/492.1; 250/492.22; 250/492.3
(58) Field of Search ................................. 250/491, 492, 250/492.1, 492.2, 492.27, 492.3; 355/18

(56) References Cited

U.S. PATENT DOCUMENTS

| | | | | |
|---|---|---|---|---|
| 5,134,300 A | * | 7/1992 | Kai et al. ................. | 250/492.1 |
| 5,173,582 A | * | 12/1992 | Sakamoto et al. ........... | 219/121 |
| 5,384,466 A | * | 1/1995 | Nakamura et al. ...... | 250/492.22 |
| 5,463,497 A | | 10/1995 | Muraki et al. .............. | 359/618 |
| 5,864,142 A | | 1/1999 | Muraki et al. ........... | 250/491.1 |
| 5,905,267 A | | 5/1999 | Muraki .................. | 250/492.22 |

* cited by examiner

Primary Examiner—John R. Lee
Assistant Examiner—David A. Vanore
(74) Attorney, Agent, or Firm—Fitzpatrick, Cella, Harper & Scinto

(57) ABSTRACT

A method of simultaneously drawing patterns in a plurality of areas on a surface to be exposed by using a plurality of electron beams is characterized in that drawing patterns are classified into a plurality of groups on the basis of the design rules, and patterns are drawn while the minimum deflection width is changed in units of groups. Pattern groups are sequentially drawn area by area. The diameter of each electron beam or the settling time therefor is changed in accordance with switching of the minimum deflection width.

10 Claims, 17 Drawing Sheets

FIG. 3
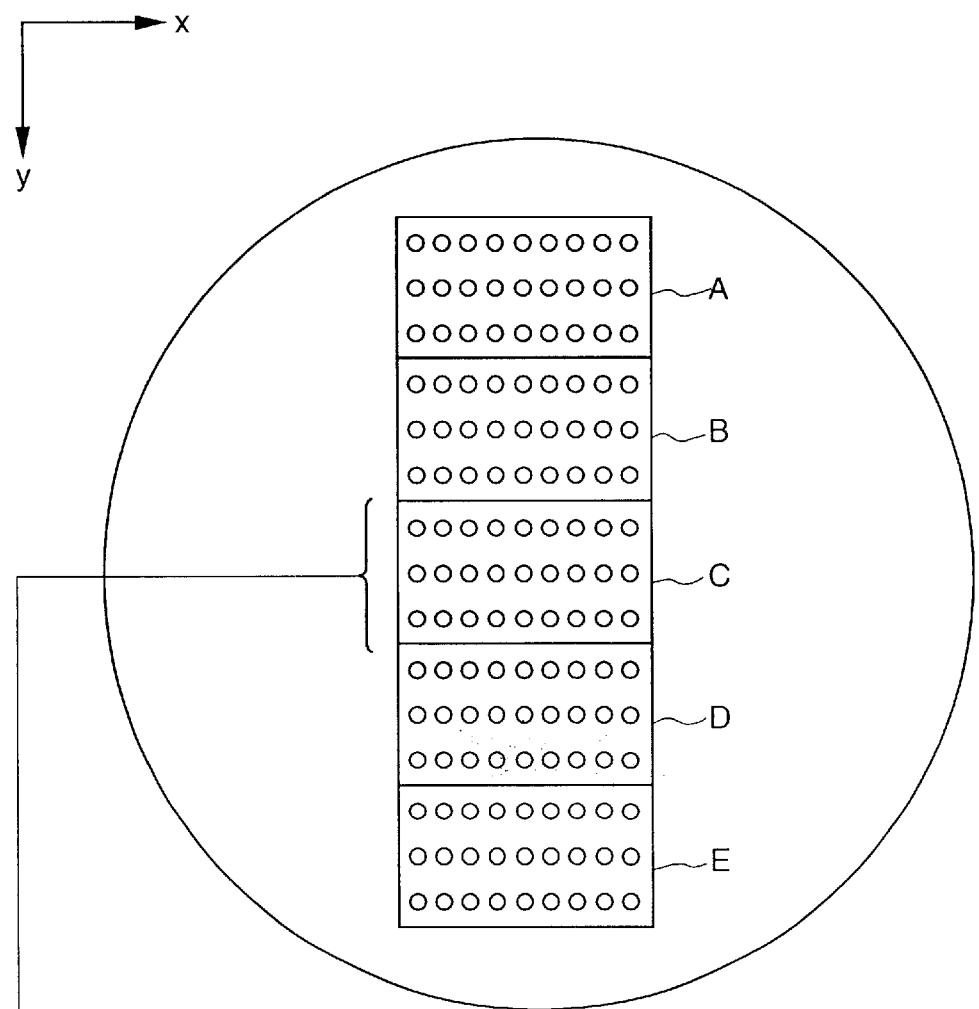
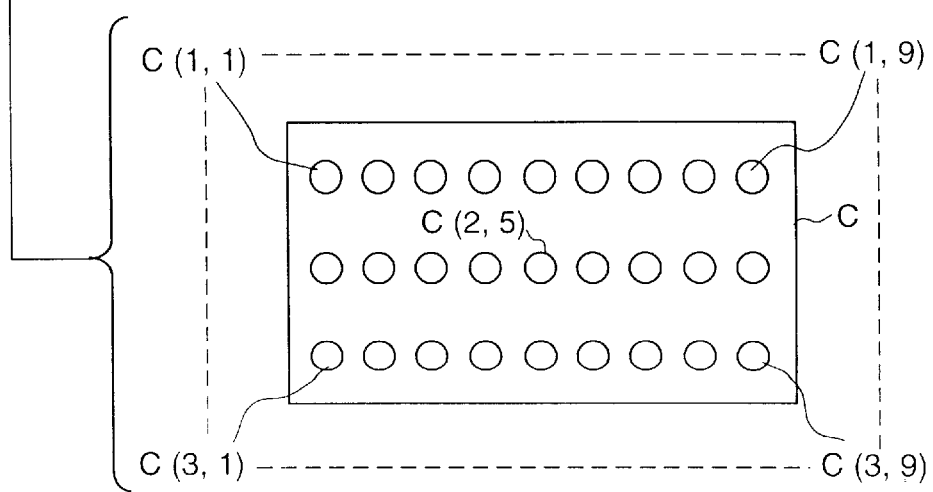

FIG. 11

[CONTENTS OF EXPOSURE CONTROL DATA]

| MAIN FIELD No. | STAGE MOVING SPEED | EXPOSURE CONTROL DATA FOR EACH SUBFIELD | | | | |
|---|---|---|---|---|---|---|
| 1 | V(1) | SFD(1) | SFD(2) | ...... | SFD(16) | |
| 2 | V(2) | SFD(1) | SFD(2) | ...... | SFD(16) | |
| ... | ... | ... | ... | ... | ... | |

[CONTENTS OF EXPOSURE CONTROL DATA SFD FOR EACH SUBFIELD]

| SUBFIELD No. | REFERENCE POSITION | NUMBER OF RE-DIVIDED SUBFIELDS | MINIMUM DEFLECTION WIDTH | BEAM DIAMETER | ARRAY POSITION | BLANKING CONTROL | | | |
|---|---|---|---|---|---|---|---|---|---|
| | | | | | | A(1, 1) | ...... | E(3, 9) | |
| n | x(n), y(n) | m | def(n, 1) | w(n, 1) | x(1), y(1) | on or off | ...... | on or off | |
| | | | | | ...... | ...... | ...... | ...... | |
| | | | | | x(k1), y(k1) | on or off | ...... | on or off | |
| | | | | | x(1), y(1) | on or off | ...... | on or off | |
| | | | def(n, m) | w(n, m) | ...... | ...... | ...... | ...... | |
| | | | | | x(km), y(km) | on or off | ...... | on or off | |

FLOW CHART FOR MANUFACTURE OF SEMICONDUCTOR DEVICE

MULTI-ELECTRON BEAM EXPOSURE METHOD AND APPARATUS AND DEVICE MANUFACTURING METHOD

BACKGROUND OF THE INVENTION

1. Field of the Invention

The present invention relates to electron beam exposure and, more particularly, to a multi-electron beam exposure method and apparatus for drawing patterns using a plurality of electron beams to directly draw patterns on a wafer, or to expose a mask or reticle, and a device manufacturing method using the same.

2. Description of the Related Art

Electron beam exposure apparatuses include: a point beam type apparatus which uses a spot-like beam; a variable rectangular beam type apparatus which uses a beam variable in its size and having a rectangular section; and a stencil mask type apparatus which uses a stencil to form a beam having a desired sectional shape.

The point beam type electron beam exposure apparatus is exclusively used for research and development purposes because of low throughput. The variable rectangular beam type electron beam exposure apparatus has a throughput higher than that of the point beam type apparatus by one to two orders, though the problem of throughput is still serious in exposing a pattern in which fine patterns having a size of about 0.1 µm are highly integrated. The stencil mask type electron beam exposure apparatus uses a stencil mask having a portion corresponding to a variable rectangular aperture in which a plurality of repeated pattern through holes are formed. The stencil mask type electron beam exposure apparatus can advantageously form repeated patterns by exposure. If a semiconductor circuit needs so many transfer patterns that they cannot be formed in one stencil mask, a plurality of stencil masks must be prepared and used one by one. The time for exchanging the masks is required, resulting in a large decrease in throughput.

An apparatus for solving this problem is a multi-electron beam exposure apparatus that irradiates a sample surface with a plurality of electron beams along designed coordinates, deflects the electron beams along the designed coordinates to scan the sample surface, and at the same time, independently turns on/off the electron beams in correspondence with the pattern to be drawn, thereby drawing a pattern. The multi-electron beam exposure apparatus can draw an arbitrary pattern without using any stencil mask, so the throughput can be increased.

FIG. 17 shows the schematic arrangement of a multi-electron beam exposure apparatus. Reference numerals 501a, 501b, and 501c denote electron guns capable of independently turning on/off electron beams; 502, a reduction electron optical system for reducing and projecting the plurality of electron beams from the electron guns 501a, 501b, and 501c on a wafer 503; and 504, a deflector for deflecting the electron beams reduced and projected on the wafer 503.

The electron beams from the electron guns 501a, 501b, and 501c are deflected by the same amount by the deflector 504. With reference to the beam reference position, the positions of the respective electron beams are sequentially settled on the wafer and the beams are deflected in an array having an array interval defined by the minimum deflection width of the deflector 504. The electron beams expose different element exposure areas in exposure patterns to be formed.

FIGS. 18, 19, and 20 show a state in which the electron beams from the electron guns 501a, 501b, and 501c expose the corresponding element exposure areas in exposure patterns (P1, P2, P3) to be formed in accordance with the same array. While the positions of the respective beams are settled and shifted on the array at the same time in the order of (1, 1), (1, 2), . . . , (1, 16), (2, 1), (2, 2), . . . , (2, 16), (3, 1), each beam is turned on at a position where an exposure pattern (P1, P2, P3) to be formed is present to expose the corresponding element exposure area in the exposure pattern (P1, P2, P3) to be formed.

In the multi-electron beam exposure apparatus, however, since a plurality of electron beams are deflected by the same minimum deflection width to simultaneously draw patterns, a pattern having a fractional size, with which a given electron beam has a deflection width other than an integer multiple of the minimum deflection width, cannot be drawn. To draw this pattern, the minimum deflection width must be set to a minimum deflection width corresponding to the greatest common divisor of a fractional pattern and an integral pattern corresponding to the current minimum deflection width. In general, since the new minimum deflection width becomes smaller than the old minimum deflection width, the amount of data for drawing increases.

The above problem will be described in detail below with reference to FIGS. 17 to 20. If all the exposure patterns P1, P2, and P3 to be formed are based on the design rule of 100 nm, the minimum deflection width is set to 25 nm, and a 100-nm pattern is drawn by scanning each electron beam four times. If only the pattern P3 is based on the design rule of 180 nm, the minimum deflection width is set to the greatest common divisor, 20 nm, of 100 nm and 80 nm. Assume that the element exposure area to be exposed by each electron beam is 3.6×3.6 ($\mu m^2$). In this case, if the minimum deflection amount is 25 nm, the number of times of settling the position of each electron beam in exposing the element exposure area is 20,736. If the minimum deflection width is 20 nm, this number is 32,400. That is, in the presence of a fractional pattern, the number of times of settling increases about 1.5 times, and the amount of data for drawing also increases about 1.5 times.

When only the pattern P3 is based on the design rule of 180 nm, in practice, a pattern having a line width of 180 nm may be approximately drawn by scanning an electron beam seven times without changing the minimum deflecting width from 25 nm. In this case, however, the drawing precision decreases.

SUMMARY OF THE INVENTION

The present invention has been made to solve the above problems in the prior art, and has as its object to provide a multi-electron beam exposure method and apparatus which can suppress a decrease in throughput even in the presence of a fractional pattern in drawing patterns. It is another object of the present invention to provide a device manufacturing method capable of manufacturing a device with a precision higher than that in the prior art by using the multi-electron beam exposure method and apparatus.

In order to achieve the above objects, according to a preferable aspect of the present invention, there is provided a multi-electron beam exposure method of simultaneously drawing in a plurality of areas of a surface to be exposed by using a plurality of electron beams, comprising classifying drawing patterns into a plurality of groups in accordance with design rules, and drawing while changing a minimum deflection width of each electron beam in units of groups.

Preferably, drawing is sequentially performed in the respective areas of the plurality of groups. In addition, the diameter of each electron beam or the settling time therefor is changed in accordance with switching of the minimum deflection width.

According to another preferable aspect of the present invention, there is provided a multi-electron beam exposure method of deflecting a plurality of electron beams onto a surface to be exposed of an object with a minimum deflection width as a unit on the basis of drawing data, independently controlling irradiation of each electron beam for each deflecting operation, and drawing a pattern in an element exposure area in units of electron beams, thereby drawing in a subfield consisting of the plurality of element exposure areas and sequentially drawing in a plurality of subfields, comprising the step of classifying pattern groups in the drawing data into a plurality of groups on the basis of design rules, and determining an optimal minimum deflection width for each group in drawing each pattern group, the first dividing step of dividing the drawing data in units of the subfields, the second dividing step of dividing a subfield having a plurality of pattern groups into subfields each having only one pattern group, and the step of, in exposing a subfield having only one pattern group, switching the minimum deflection width to an optimal minimum deflection width corresponding to the group, and deflecting the plurality of electron beams with the optimal minimum deflection width as a unit, thereby drawing a pattern.

Preferably, the second dividing step comprises the step of comparing a drawing time required when the subfield is divided into subfields each having only one pattern group and drawing is sequentially performed in the respective subfields with an optimal minimum deflection width corresponding to the group in each subfield as a unit, with a drawing time required when drawing is performed in the subfield before a dividing operation with an optimal minimum deflection width corresponding to a plurality of groups belonging to the subfield as a unit, thereby determining whether to divide the subfield into subfields each having only one pattern group. Further preferably, the optimal minimum deflection width corresponding to the plurality of groups is a greatest common divisor of minimum deflection widths of the respective groups.

The method preferably further comprises the step of switching the diameters of the plurality of electron beams in accordance with switching of the minimum deflection widths in exposing each subfield.

The method preferably further comprises the step of switching the settling times for the plurality of electron beams in accordance with switching of the minimum deflection widths in exposing each subfield.

According to still another preferable aspect of the present invention, there is provided a device manufacturing method comprising the manufacturing step including the step of drawing a pattern using the method described above.

According to still another preferable aspect of the present invention, there is provided a multi-electron beam exposure apparatus for classifying pattern groups to be drawn into a plurality of groups based on pattern sizes, and deflecting a plurality of electron beams with optimal minimum deflection widths for the respective groups in drawing the classified groups, thereby drawing the pattern groups on a surface to be exposed, comprising deflection means for deflecting the plurality of electron beams onto the surface to be exposed, irradiation control means for independently controlling irradiation of each electron beam in each deflection operation, and control means for causing the deflection means to deflect the plurality of electron beams onto a surface to be exposed with a minimum deflection width as a unit, and causing the irradiation control means to independently control irradiation of each electron beam in each deflecting operation and draw a pattern in an element exposure area for each electron beam so as to draw in a subfield consisting of the plurality of element exposure areas, and for, when drawing is to be sequentially performed in a plurality of subfields, causing the irradiation means to inhibit irradiation of some of the plurality of electron beams so as to divide a subfield having a plurality of pattern groups into subfields each having one pattern group and draw in each subfield, thereby drawing while switching to an optimal minimum deflection width corresponding to the group in each divided subfield.

Preferably, the control means switches diameters of the plurality of electron beams in accordance with switching of the minimum deflection width. In addition, the control means switches settling times for the plurality of electron beams settled by the deflection means in accordance with switching the minimum deflection width.

In order to achieve the above objects, according to still another preferable aspect of the present invention, a multi-electron beam exposure method of deflecting a plurality of electron beams onto a surface of an object to be exposed with a minimum deflection width as a unit on the basis of drawing data while continuously moving a stage on which an object to be exposed is mounted, independently controlling irradiation of each electron beam for each deflecting operation, drawing a pattern in an element exposure area in units of electron beams so as to draw in a subfield consisting of the plurality of element exposure areas and sequentially drawing in a plurality of subfields, sequentially drawing in a plurality of subfields aligned in a direction perpendicular to a continuously moving direction to draw in a main field consisting of the plurality of subfields, and sequentially drawing in a plurality of main fields aligned in the continuously moving direction, comprising the step of classifying pattern groups in the drawing data into a plurality of groups on the basis of design rules, and determining an optimal minimum deflection width for each group in drawing each pattern group, the first dividing step of dividing the drawing data in units of the subfields, the second dividing step of dividing a subfield having a plurality of pattern groups into subfields each having only one pattern group, the first determination step of, in exposing a subfield having only one pattern group, determining to switch the minimum deflection width to an optimal minimum deflection width corresponding to the group, and deflect the plurality of electron beams with the optimal minimum deflection width as a unit, thereby drawing, the step of calculating a drawing time for reach main field, and the second determination step of determining to set a moving speed of the stage to a moving speed that allows drawing in each main field within the drawing time calculated for each main field.

Preferably, the second dividing step comprises the step of comparing a drawing time required when the subfield is divided into subfields each having only one pattern group and drawing is sequentially performed in the respective subfields with an optimal minimum deflection width corresponding to the group in each subfield as a unit, with a drawing time required when drawing is performed in the subfield before a dividing operation with an optimal minimum deflection width corresponding to a plurality of groups belonging to the subfield as a unit, thereby determining whether to divide the subfield into subfields each having only one pattern group. Further preferably, the optimal minimum deflection width corresponding to the plurality of groups is a greatest common divisor of minimum deflection widths of the respective groups.

The method preferably further comprises the step of switching the diameters of the plurality of electron beams in accordance with switching of the minimum deflection widths in exposing each subfield.

The method preferably further comprises the step of switching the settling times for the plurality of electron beams in accordance with switching of the minimum deflection widths in exposing each subfield.

The second determination step preferably comprises the step of determining a moving speed of the stage in units of main fields. Further preferably, the second determination step comprises the step of re-determining a moving speed of one of main fields adjacent in the continuously moving direction for which a higher moving speed is determined to set the moving speed to be lower than the determined moving speed so as to make a difference between the determined moving speeds of the adjacent main fields stay not more than a predetermined value.

Preferably, the method further comprises the step of sequentially drawing in a plurality of main fields aligned in the continuously moving direction to draw in a frame consisting of the plurality of main fields, and sequentially drawing in a plurality of frames aligned in a direction perpendicular to the continuously moving direction, and the second determination step comprises the step of determining a moving speed of the stage in units of frames.

According to still another preferable aspect of the present invention, there is provided a device manufacturing method comprising the manufacturing step including the step of drawing a pattern using the method described above.

According to still another preferable aspect of the present invention, there is provided a multi-electron beam exposure apparatus for classifying pattern groups to be drawn into a plurality of groups based on pattern sizes, and deflecting a plurality of electron beams with optimal minimum deflection widths for the respective groups in drawing the classified groups, thereby drawing the pattern groups on an object surface to be exposed, comprising a stage which moves with the object to be exposed being mounted thereon, deflection means for deflecting the plurality of electron beams into the surface to be exposed, irradiation control means for independently controlling irradiation of each electron beam in each deflection operation, and control means for causing the deflection means to deflect the plurality of electron beams onto a surface to be exposed with a minimum deflection width as a unit while continuously moving the stage, causing the irradiation control means to independently control irradiation of each electron beam in each deflecting operation and draw a pattern in an element exposure area for each electron beam so as to draw in a subfield consisting of the plurality of element exposure areas, sequentially drawing in a plurality of subfields aligned in a direction perpendicular to a continuously moving direction to draw in a main field consisting of the plurality of subfields, and for, when drawing is to be sequentially performed in a plurality of main fields aligned in the continuously moving direction, causing the irradiation means to inhibit irradiation of some of the plurality of electron beams so as to divide a subfield having a plurality of pattern groups into subfields each having one pattern group and draw in each subfield, thereby drawing while switching to an optimal minimum deflection width corresponding to the group in each divided subfield, and controlling the moving speed of the stage, on the basis of an exposure time for each main field, to a moving speed that allows exposure on each main field within the exposure time therefor.

Preferably, the apparatus further comprises means for switching diameters of the plurality of electron beams, and the control means switches the diameters of the plurality of electron beams in accordance with switching of the minimum deflection width.

Preferably, the apparatus further comprises means for switching diameters of the plurality of electron beams, and the control means switches settling times for the plurality of electron beams in accordance with switching of the minimum deflection width.

The control means preferably switches the moving speed of the stage when the main field in which drawing is to be performed changes. Further preferably, when the moving speed of the stage is switched, the control means controls the moving speed of the stage to make a difference between the moving speeds stay not more than a predetermined value.

Preferably, the control means causes the deflection means to deflect a plurality of electron beams so as to sequentially draw in a plurality of main fields aligned in the continuously moving direction, thereby drawing in a main field consisting of the plurality of main fields, causes the stage to step the object to be exposed so as to sequentially draw in a plurality of frames aligned in a direction perpendicular to the continuously moving direction, and switches the moving speed of the stage when the frame in which a pattern is to be drawn changes.

Preferably, the deflection means comprises an electromagnetic deflector and an electrostatic deflector, and the control means uses the electrostatic deflector to deflect the plurality of electron beams in the element exposure area and uses the electromagnetic deflector to deflect the plurality of electron beams from a subfield to a next subfield.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3 is a view for explaining an element electron optical system array 3;

FIG. 11 is a view for explaining exposure control data;

DETAILED DESCRIPTION OF THE PREFERRED EMBODIMENTS

<Basic Principle of Present Invention>

Figure 1A:
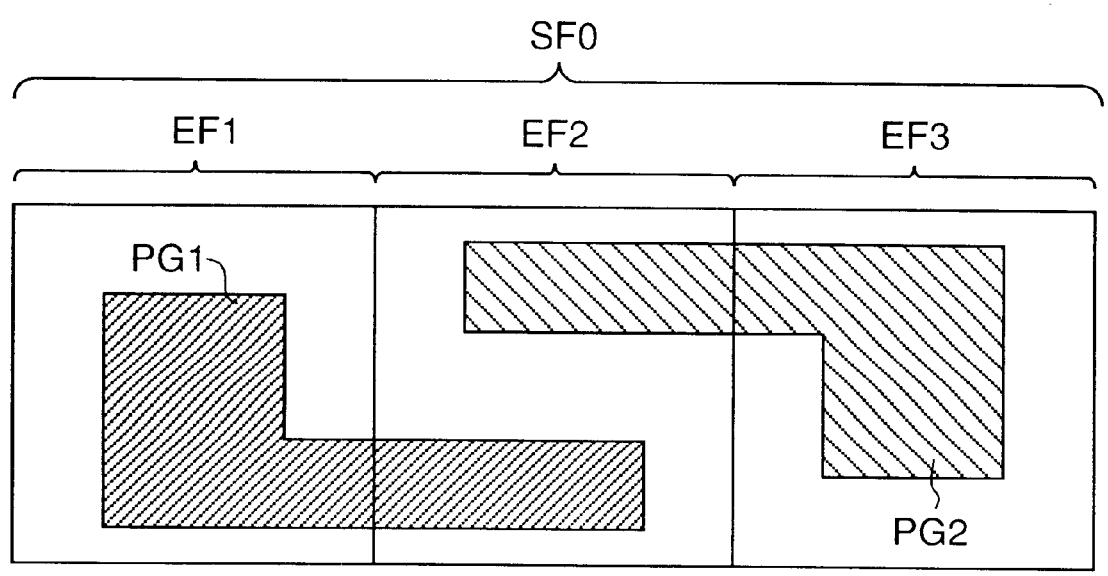
FIGS. 1A and 1B are views for explaining the basic principle of the present invention.

Prior to a description of the embodiments, the basic principle of the present invention will be described in detail below with reference to FIG. 1A. In this case, the area constituted by element exposure areas EF1, EF2, and EF3 in which patterns are simultaneously drawn by deflecting a plurality of electron beams by the common minimum deflection width is defined as a subfield SF0. Assume that a pattern group PG1 to be formed by exposure is based on the design rule of 100 nm, and a pattern group PG2 is based on the design rule of 180 nm. In this case, according to the prior art, in drawing patterns in the subfield SF0, the minimum deflection width is set to 20 nm, which is the greatest common divisor of 100 nm and 180 nm. In this case, the number of times of settling the position of each electron beam is 32,400. Note that each of the electron beam element exposure areas EF1, EF2, and EF3 has a size of 3.6×3.6 ($\mu$m$^2$).

Figure 1B:
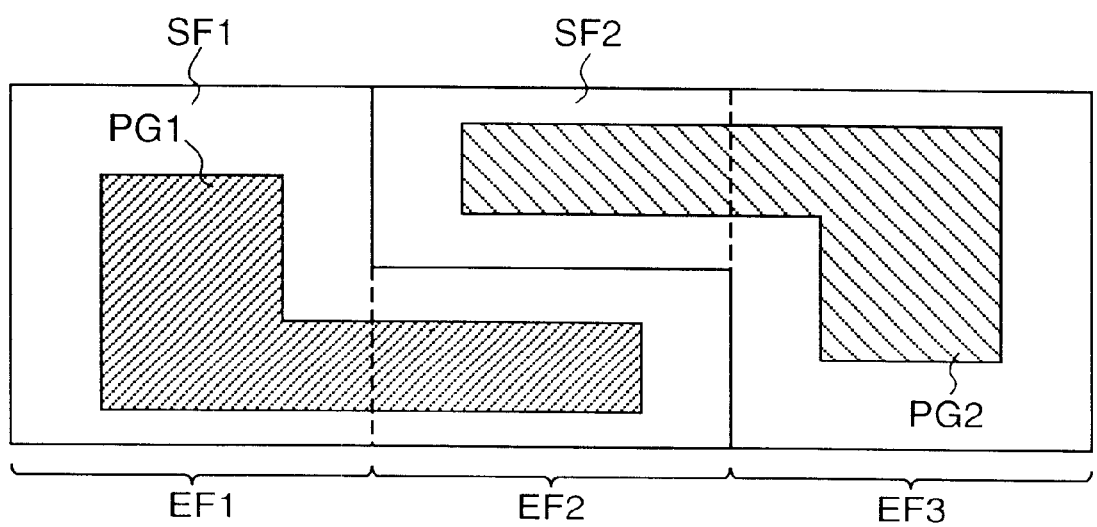

In the present invention, when pattern groups based on different design rules are present in the exposure subfield SF0, the subfield SF0 is divided into a plurality of subfields SF1 and SF2 in each of which only a pattern group based on a single design rule is present, as shown in FIG. 1B. The minimum deflection width is set to 25 nm, and the pattern group PG1 in the subfield SF1 is drawn while the irradiation of each electron beam other than the corresponding electron beam positioned in the subfield SF1 is inhibited. Thereafter, the minimum deflection width is set to 45 nm, and the pattern group PG2 in the subfield SF2 is drawn while the irradiation of each electron beam other than the electron beam corresponding to the element exposure area and positioned in the subfield SF2 is inhibited. In this case, the number of times of settling the position of each electron beam is 27,136. That is, the number of times of settling in the present invention can be decreased to about 84% of the number of times of settling in the prior art without any decrease in drawing precision.

<First Embodiment>

<Description of Constituent Elements of Electron Beam Exposure Apparatus>

Figure 2:
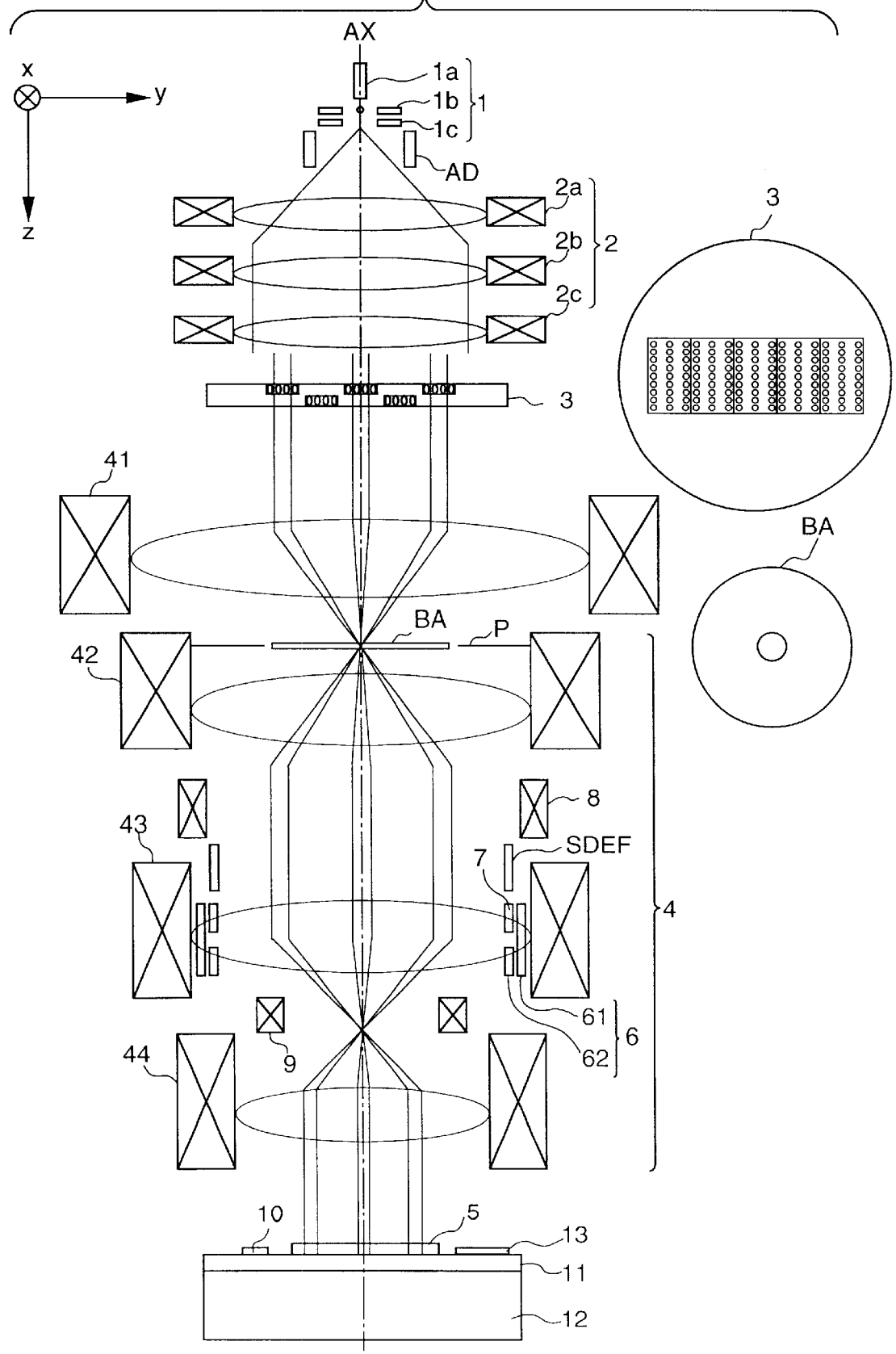
FIG. 2 is a schematic view showing the main part of an electron beam exposure apparatus according to the present invention.

FIG. 2 is a schematic view of the main part of an electron beam exposure apparatus according to the present invention.

Referring to FIG. 2, reference numeral 1 denotes an electron gun consisting of a cathode 1a, a grid 1b, and an anode 1c. Electrons emitted by the cathode 1a form a crossover image between the grid 1b and the anode 1c (the crossover image will be referred to as an electron source hereinafter).

The electrons emitted by the electron sources are formed into an essentially collimated electron beam by an illumination electron optical system 2 whose front focal position is settled at the position of the electron source. An element electron optical system array 3 is irradiated with the nearly collimated electron beam. The illumination electron optical system 2 consists of electron lenses 2a, 2b, and 2c. By adjusting the electron optical powers (focal lengths) of at least two of the electron lenses 2a, 2b, and 2c, the focal length of the illumination electron optical system 2 can be changed while the focal position of the illumination electron optical system 2 on the electron source side is kept fixed. That is, the focal length of the illumination electron optical system 2 can be changed while the electron beam from the illumination electron optical system 2 is essentially collimated.

The nearly collimated electron beam leaving the illumination electron optical system 2 is incident on the element electron optical system array 3. The element electron optical system array 3 is formed by two-dimensionally arraying a plurality of element electron optical systems each consisting of an aperture, an electron optical system, and a blanking electrode, in a direction perpendicular to an optical axis AX. The element electron optical system array 3 will be described in detail later.

The element electron optical system array 3 forms a plurality of intermediate images of the electron source. The respective intermediate images are reduced and projected by a reduction electron optical system 4 to form electron source images having almost the same size on a wafer 5. Letting Ws be the size of the electron source, Fi be the focal length of the illumination electron optical system 2, and Fe be the focal length of each electron optical system of the element electron optical system, a size Wm of each intermediate image of the electron source is given by $$Wm=Ws*Fe/Fi$$

The sizes of the intermediate images of the electron source can be simultaneously changed by changing the focal length of the illumination electron optical system 2. Hence, the sizes of the electron source images on the wafer 5 can be simultaneously changed. The focal lengths and the like of the respective element electron optical systems are set to make the sizes of the electron source images on the wafer 5 substantially equal to each other. In addition, the element electron optical system array 3 changes the positions of the intermediate images along the optical axis in accordance with the curvature of field of the reduction electron optical system 4, and at the same time, corrects in advance any aberration produced when each intermediate image is reduced and projected on the wafer 5 by the reduction electron optical system 4.

The reduction electron optical system 4 is a symmetrical magnetic doublet consisting of a first projection lens 41 (43) and a second projection lens 42 (44). When the focal length of the first projection lens 41 (43) is represented by f1, and that of the second projection lens 42 (44) is represented by f2, the distance between the two lenses is f1+f2. The object point on the optical axis AX is located at the focal position of the first projection lens 41 (43), and the image point is set at the focal point of the second projection lens 42 (44). This image is reduced to −f2/f1. Since the two lens magnetic fields are set to act in opposite directions, the Seidel's aberrations except five aberrations, i.e., spherical aberration, isotropic astigmatism, isotropic coma, curvature of field, and on-axis chromatic aberration, and chromatic aberrations associated with rotation and magnification are canceled in theory.

Reference numeral 6 denotes a drawing deflector for deflecting the plurality of electron beams from the element electron optical system array 3 to deflect the plurality of electron source images in the X and Y directions on the wafer 5 by roughly the same amounts. The deflector 6 is constituted by a main deflector 61 having a large deflection width but demanding a long time for settling, i.e., a long settling time, and a subdeflector 62 having a small deflection width but demanding a short time for settling, i.e., a short settling time. The main deflector 61 is an electromagnetic deflector, and the subdeflector 62 is an electrostatic deflector.

Reference symbol SDEF denotes a stage following deflector for making the plurality of electron beams from the element electron optical system array 3 follow the continuous movement of an X-Y stage 12. The stage following deflector SDEF is an electrostatic deflector.

Reference numeral 7 denotes a dynamic focus coil for correcting any shift of the focus position of the electron source image caused by deflection errors produced when the deflector 6 is actuated; and 8, a dynamic stigmatic coil for correcting astigmatism caused by deflection errors produced by deflection, like the dynamic focus coil 7.

Reference numeral 9 denotes a reflected electron detector for adjusting the focal position of the reduction electron optical system 4 to correct the defocusing of electron beams which takes place due to the Coulomb effect when the number of electron beams or the sum of currents applied to the wafer increases.

Reference numeral 10 denotes a Faraday cup having two single knife-edges extending in the X and Y directions. The Faraday cup 10 detects the charge amount of the electron source image formed by the electron beam from the element electron optical system.

Reference numeral 11 denotes a θ-Z stage with a wafer mounted, which is movable along the optical axis AX (Z-axis) and in a rotational direction about the Z-axis. A stage reference plate 13 and the Faraday cup 10 are fixed on the θ-Z stage 11.

The X-Y stage 12 with the θ-z stage 11 mounted is movable in the X and Y directions perpendicular to the optical axis AX (Z-axis).

The element electron optical system array 3 will be described next. In the element electron optical system array 3, a plurality of element electron optical systems are formed into a group (subarray), and a plurality of subarrays are formed. For example, as shown in FIG. 3, five subarrays A to E are formed. In each subarray, a plurality of element electron optical systems are two-dimensionally arrayed. In each subarray of this embodiment, 27 element electron optical systems C(1,1) to C(3,9) are formed.

Figure 4:
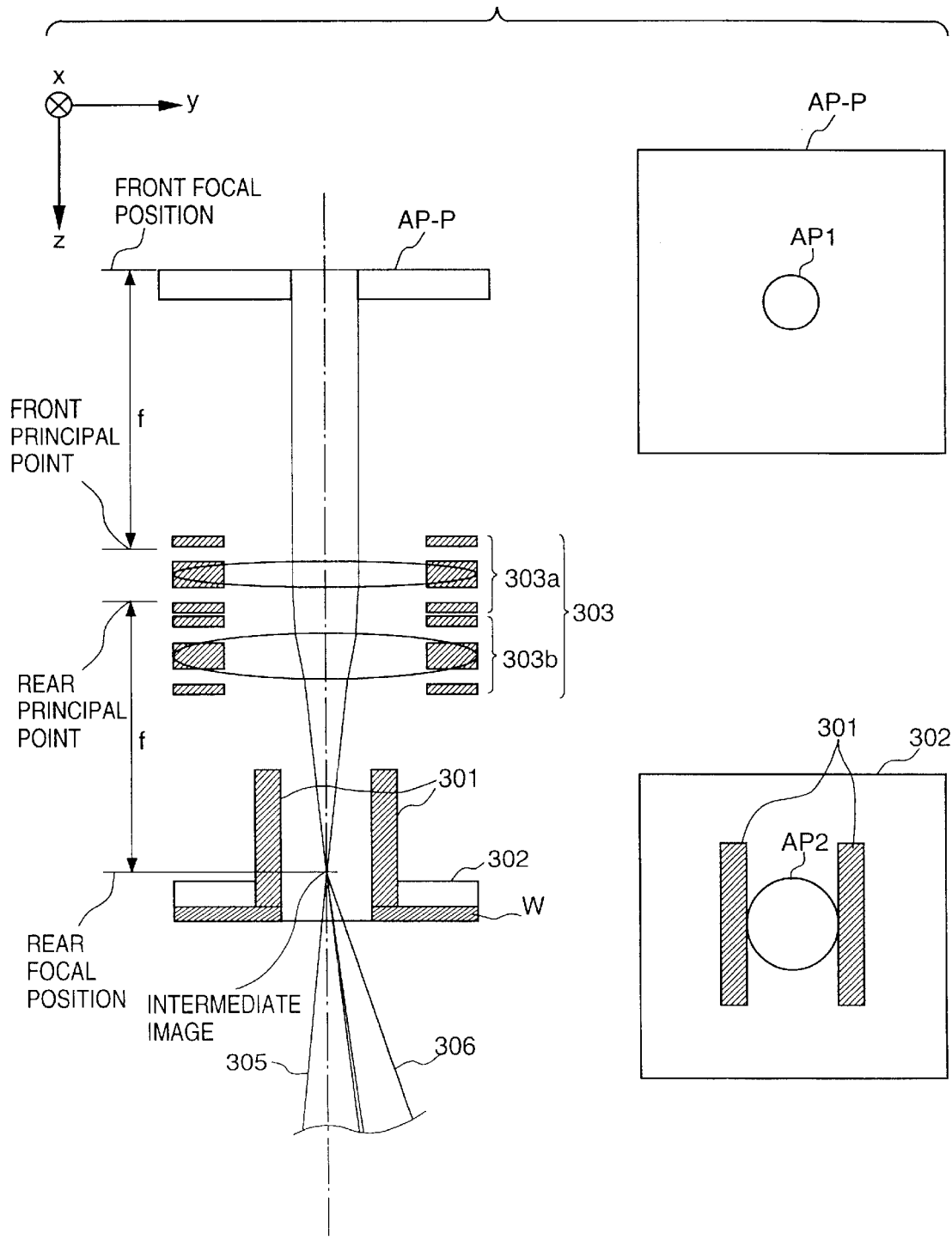
FIG. 4 is a view for explaining an element electron optical system.

FIG. 4 is a sectional view of each element electron optical system.

Referring to FIG. 4, reference symbol AP-P denotes a substrate which is illuminated with the electron beam almost collimated by the illumination electron optical system 2 and has an aperture AP1 for defining the shape of the passing electron beam. This substrate is common to the remaining element electron optical systems. That is, the substrate AP-P has a plurality of apertures.

Reference numeral 301 denotes a blanking electrode consisting of a pair of electrodes and having a deflection function; and 302, a substrate common to the remaining element electron optical systems and having an aperture AP2. A wiring layer (W) for turning on/off the blanking electrode 301 is formed on the substrate 302. That is, the substrate 302 has a plurality of apertures and a plurality of blanking electrodes.

Reference numeral 303 denotes an electron optical system using two unipotential lenses 303a and 303b each consisting of three aperture electrodes and having a converging function for setting the upper and lower electrodes at an acceleration potential V0 and the intermediate electrode at another potential V1 or V2. The respective aperture electrodes are stacked on each other on a substrate through insulators. This substrate is common to the remaining element electron optical systems. That is, the substrate has a plurality of electron optical systems 303.

Figure 5A:
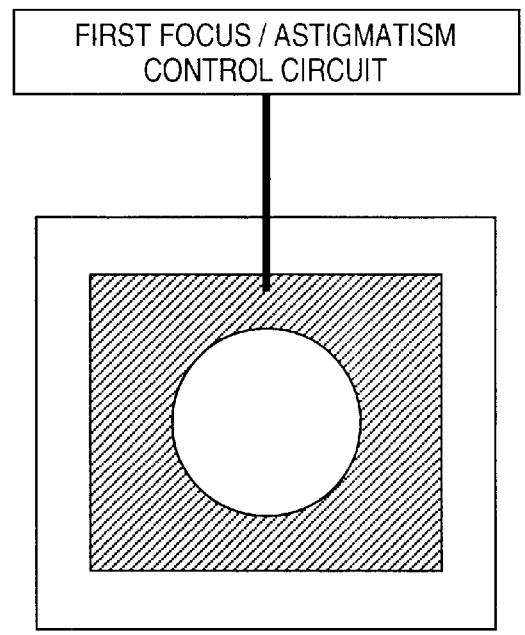
FIGS. 5A and 5B are views for explaining the electrodes of an element electron optical system.

Upper, intermediate, and lower electrodes of the unipotential lens 303a and upper and lower electrodes of the unipotential lens 303b have a shape like the one shown in FIG. 5A. In all the element electron optical systems, the upper and lower electrodes of the unipotential lenses 303a and 303b are set at a common potential by a first focus/astigmatism control circuit (to be described later).

The potential of the intermediate electrode of the unipotential lens 303a can be set for each element electron optical system by the first focus/astigmatism control circuit. For this reason, the focal length of the unipotential lens 303a can be set for each element electron optical system.

Figure 5B:
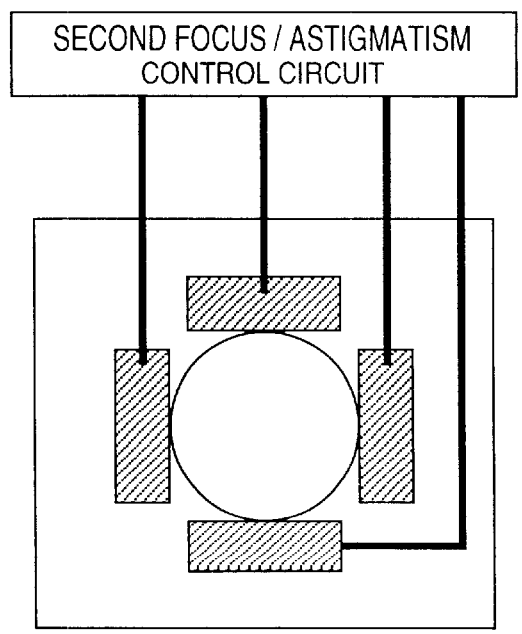

The intermediate electrode of the unipotential lens 303b is comprised of four electrodes as shown in FIG. 5B. The potentials of electrodes can be independently set by the first focus/astigmatism control circuit, and the potentials of each element electron optical system can be also independently set. Therefore, the focal length of the unipotential lens 303b can be changed along sections perpendicular to each other. The focal length of the unipotential lens 303b can be independently set for each element electron optical system.

As a result, when the intermediate electrodes of the element electron optical systems 303 are independently controlled, the electron optical characteristics (intermediate image formation positions and astigmatism) of the element electron optical systems can be controlled. In this case, in controlling the intermediate image formation positions, since the size of each intermediate image is determined by the ratio of the focal length of the illumination electron optical system 2 to the focal length of the electron optical system 303 as described above, the principal point of the electron optical system 303 is shifted to move the intermediate image formation position while the focal length of the electron optical system 303 is kept constant. With this operation, the positions of the intermediate images formed by all the element electron optical systems along the optical axis can be changed while the sizes of the intermediate images are made virtually equal to each other.

The electron beam formed into a nearly collimated beam by the illumination electron optical system 2 forms an intermediate image of the electron source through the aperture AP1 and the electron optical system 303. In this case, at or near the front focal position of the electron optical system 303, the corresponding aperture AP1 is located. At or near the intermediate image formation position of the electron optical system 303 (the rear focal position of the electron optical system 303), the corresponding blanking electrode 301 is located. In this arrangement, if no electric field is applied between the electrodes of the blanking electrode 301, an electron beam is not deflected like an electron beam 305. On the other hand, when an electric field is applied between the electrodes of the blanking electrode 301, an electron beam is deflected like an electron beam 306. Since the electron beams 305 and 306 have different angular distributions on the object plane of the reduction electron optical system 4, the electron beams 305 and 306 strike different areas at the pupil position (on a plane P in FIG. 2) of the reduction electron optical system 4. Therefore, a blanking aperture BA for passing only the electron beam 305 is formed at the pupil position (on the plane P in FIG. 2) of the reduction electron optical system.

To correct any curvature of field/astigmatism produced when the intermediate image is reduced and projected on the surface to be exposed by the reduction electron optical system 4, the potentials of the two intermediate electrodes of each element electron optical system are independently set to change the electron optical characteristics (intermediate image formation position and astigmatism) of the element electron optical system. In this embodiment, however, to minimize the wiring lines between the intermediate electrodes and the first focus/astigmatism control circuit, the element electron optical systems in the same subarray are set to have the same electron optical characteristics so that the electron optical characteristics (intermediate image formation positions and astigmatism) of the element electron optical systems are controlled in units of subarrays.

To correct any distortion produced when the plurality of intermediate images are reduced and projected on the surface to be exposed by the reduction electron optical system 4, the distortion characteristic of the reduction electron optical system 4 is determined in advance, and the position of each element electron optical system along the direction perpendicular to the optical axis of the reduction electron optical system 4 is set on the basis of the distortion characteristic.

Figure 6:
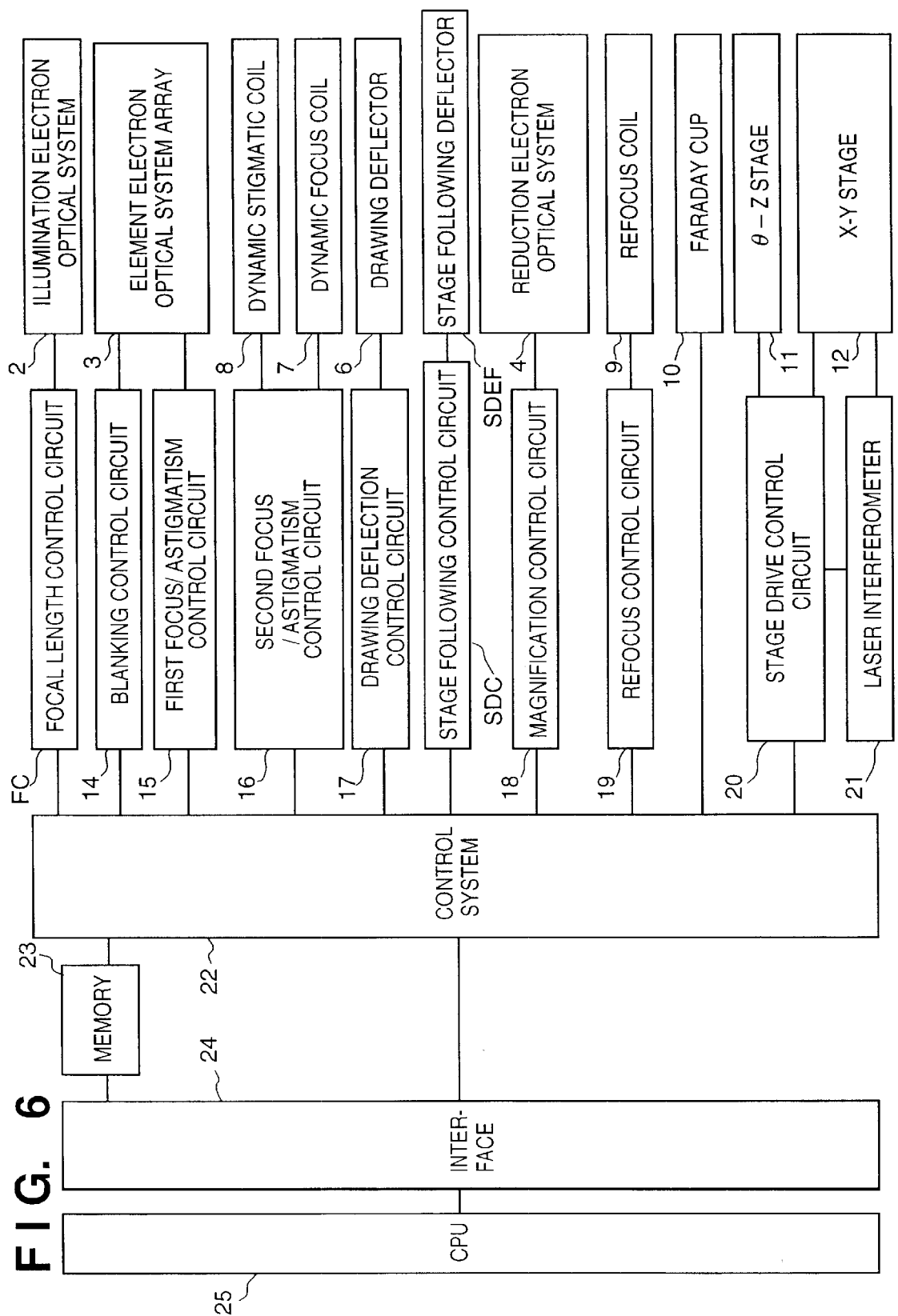
FIG. 6 is a block diagram for explaining a system configuration according to the present invention.

FIG. 6 shows the system configuration of this embodiment.

A focal length control circuit FC controls the focal length of the illumination electron optical system 2 while holding the focal position of the illumination electron optical system 2 on the electron source side by adjusting the electron optical powers (focal lengths) of at least two of the electron lenses 2a, 2b, and 2c of the illumination electron optical system 2.

A blanking control circuit 14 independently ON/OFF-controls the blanking electrode of each element electron optical system of the element electron optical system array 3. A first focus/astigmatism control circuit 15 independently controls the electron optical characteristics (intermediate image formation position and astigmatism) of each element electron optical system of the element electron optical system array 3.

A second focus/astigmatism control circuit 16 controls the dynamic stigmatic coil 8 and the dynamic focus coil 7 to control the focal position and astigmatism of the reduction electron optical system 4. A drawing deflection control circuit 17 controls the deflector 6. A stage following control circuit SDC controls the stage following deflector SDEF to make each electron beam follow the continuous movement of the X-Y stage 12. A magnification adjustment circuit 18 controls the magnification of the reduction electron optical system 4. A refocus control circuit 19 controls the current to be flowed in the refocus coil 9 to adjust the focal position of the reduction electron optical system 4.

A stage drive control circuit 20 drives and controls the θ-Z stage and also drives and controls the X-Y stage 12 in cooperation with a laser interferometer 21 for detecting the position of the X-Y stage 12.

A control system 22 controls the above-described plurality of control circuits, the refocus coil 9, and the Faraday cup 10 in synchronism with each other for exposure and alignment based on exposure control data from a memory 23. The control system 22 is controlled by a CPU 25 which controls the overall electron beam exposure apparatus through an interface 24. <Description of Exposure Operation>

The exposure operation of the electron beam exposure apparatus of this embodiment will be described below with reference to FIG. 7.

On the basis of the exposure control data from the memory 23, the control system 22 directs the drawing deflection control circuit 17 to cause the subdeflector 62 of the deflector 6 to deflect the plurality of electron beams from the element electron optical system array, and also directs the blanking control circuit 14 to turn on/off the blanking electrodes of the respective element electron optical systems in accordance with the exposure pattern to be formed on the wafer 5. At this time, the X-Y stage 12 continuously moves in the X direction. The control system 22 directs the stage following control circuit SDC to make the stage following deflector SDEF deflect the electron beams so as to cause them to follow the movement of the X-Y stage 12. The electron beam from each element electron optical system scans to expose an element exposure area EF on the wafer 5, as shown in FIG. 7. In this embodiment, Sx=Sy=3.6 $\mu$m. Since the element exposure areas EF corresponding to the element electron optical systems of the element electron optical system array are set to be two-dimensionally adjacent to each other, the element exposure areas EF are arrayed to be two-dimensionally adjacent to each other, and subfields SF, each consisting of a plurality of element exposure areas EF to be simultaneously exposed, are exposed. In this embodiment, M (=64) element exposure areas are arrayed in the X direction, and N (=64) element exposure areas EF are arrayed in the Y direction. The size of each subfield SF is 230.4×230.4 $\mu$m.

Figure 7:
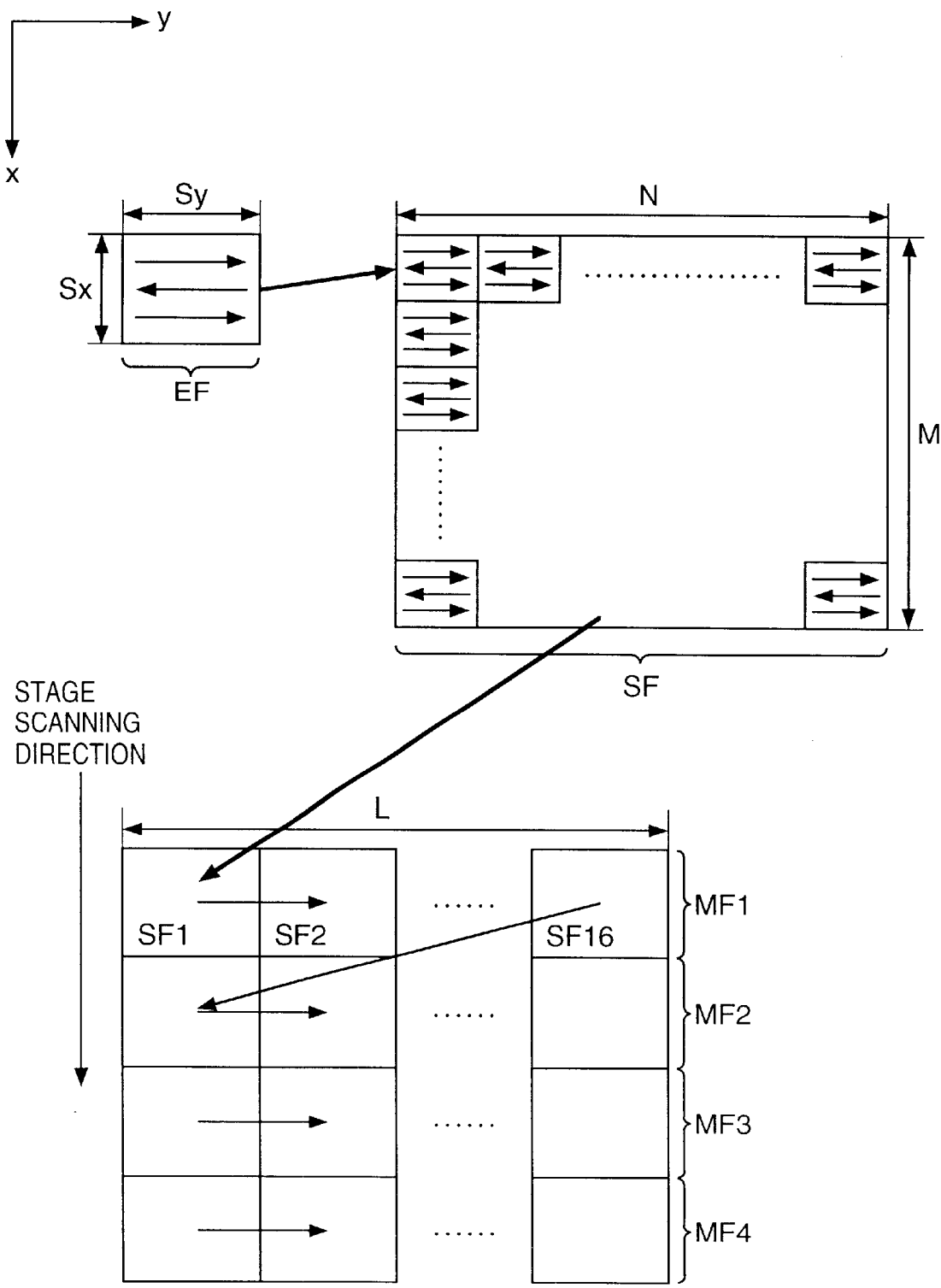
FIG. 7 is a view for explaining exposure fields (EF), subfields (SF), and main fields (MF)

The control system 22 directs the drawing deflection control circuit 17 to cause the main deflector 61 of the drawing deflector 6 to deflect the plurality of electron beams from the element electron optical system array in a direction perpendicular to the stage scanning direction in order to expose subfield 2 (SF2) after exposing subfield 1 (SF1) in FIG. 7. The control system 22 directs the drawing deflection control circuit 17 again to cause the sub-deflector 62 of the drawing deflector 6 to deflect the plurality of electron beams from the element electron optical system array, and also directs the blanking control circuit 14 to turn on/off the blanking electrode of each element electron optical system in accordance with the pattern to be formed on the wafer 5 by exposure, thereby exposing subfield 2 (SF2). Thereafter, as shown in FIG. 7, subfields SF1 to SF16 are sequentially exposed to form a pattern on the wafer 5 by exposure. As a result, a main field MF consisting of the subfields SF1 to SF16 arrayed in a direction perpendicular to the stage scanning direction is exposed. In this case, L (=16) subfields are arrayed in the Y direction, and the size of each main field MF is 230.4×3686.4($\mu$m$^2$).

After exposing main field 1 (MF1) in FIG. 7, the control system 22 directs the drawing deflection control circuit 17 to sequentially deflect the plurality of electron beams from the element electron optical system array toward main fields MF2, MF3, MF4, . . . juxtaposed in the stage scanning direction, thereby forming a pattern on the wafer 5 by exposure.

The electron beam exposure apparatus of this embodiment deflects a plurality of electron beams on a wafer while continuously moving the stage on which the wafer is placed. The apparatus controls the irradiation of each electron beam for each deflecting operation to draw a pattern in each element exposure area for each electron beam, thereby drawing a pattern in each subfield consisting of a plurality of element exposure areas. By sequentially drawing patterns in a plurality of subfields aligned in a direction perpendicular to the continuously moving direction, a pattern is drawn in a main field consisting of a plurality of subfields. Furthermore, the apparatus sequentially draws patterns in a plurality of main fields aligned in the continuously moving direction.

<Description of Exposure Control Data Creation Processing>

A method of creating exposure control data for the electron beam exposure apparatus of this embodiment will be described.

Figure 8:
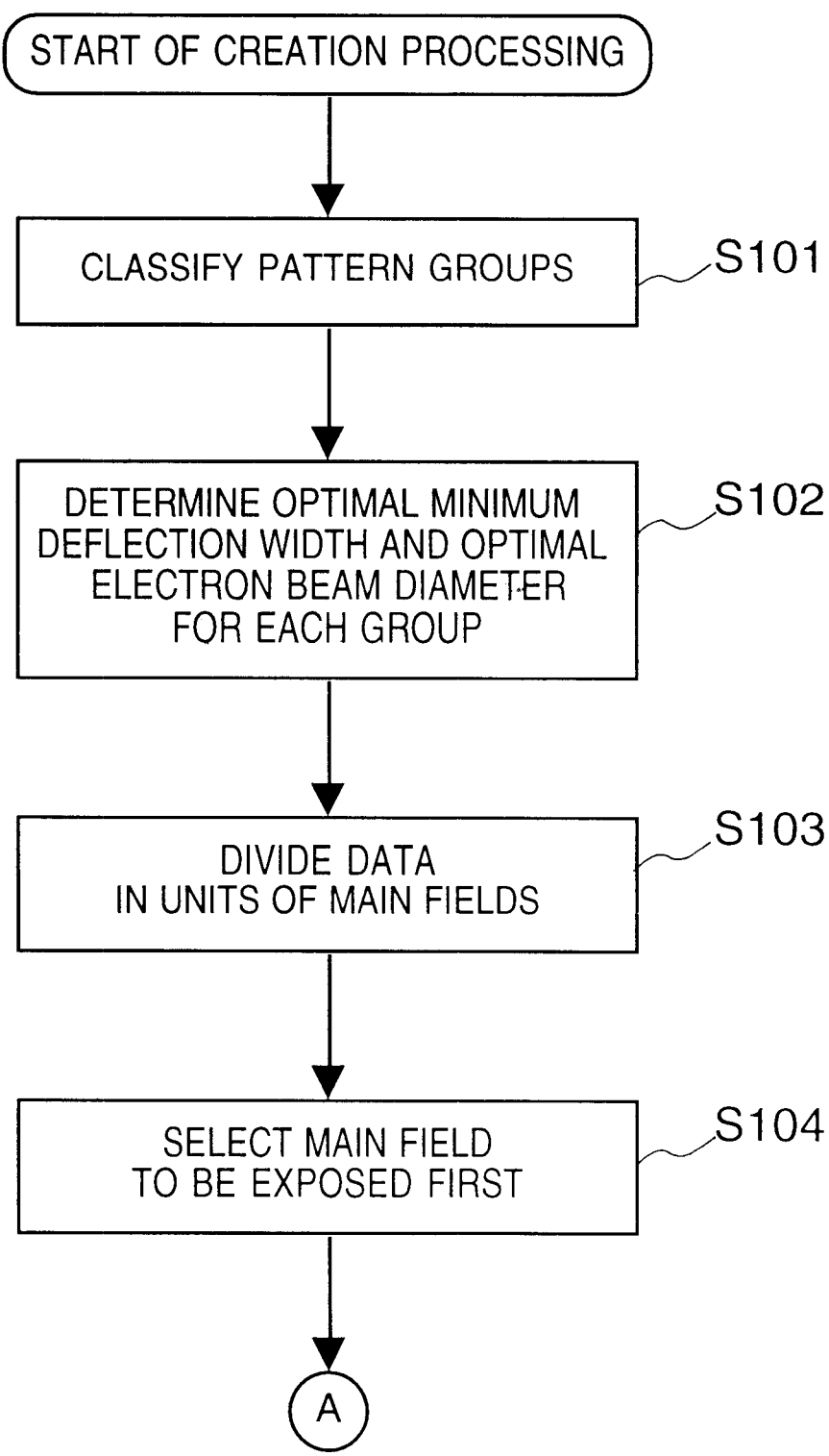
FIG. 8 is a flow chart for explaining exposure control data creation processing.
Figure 9:
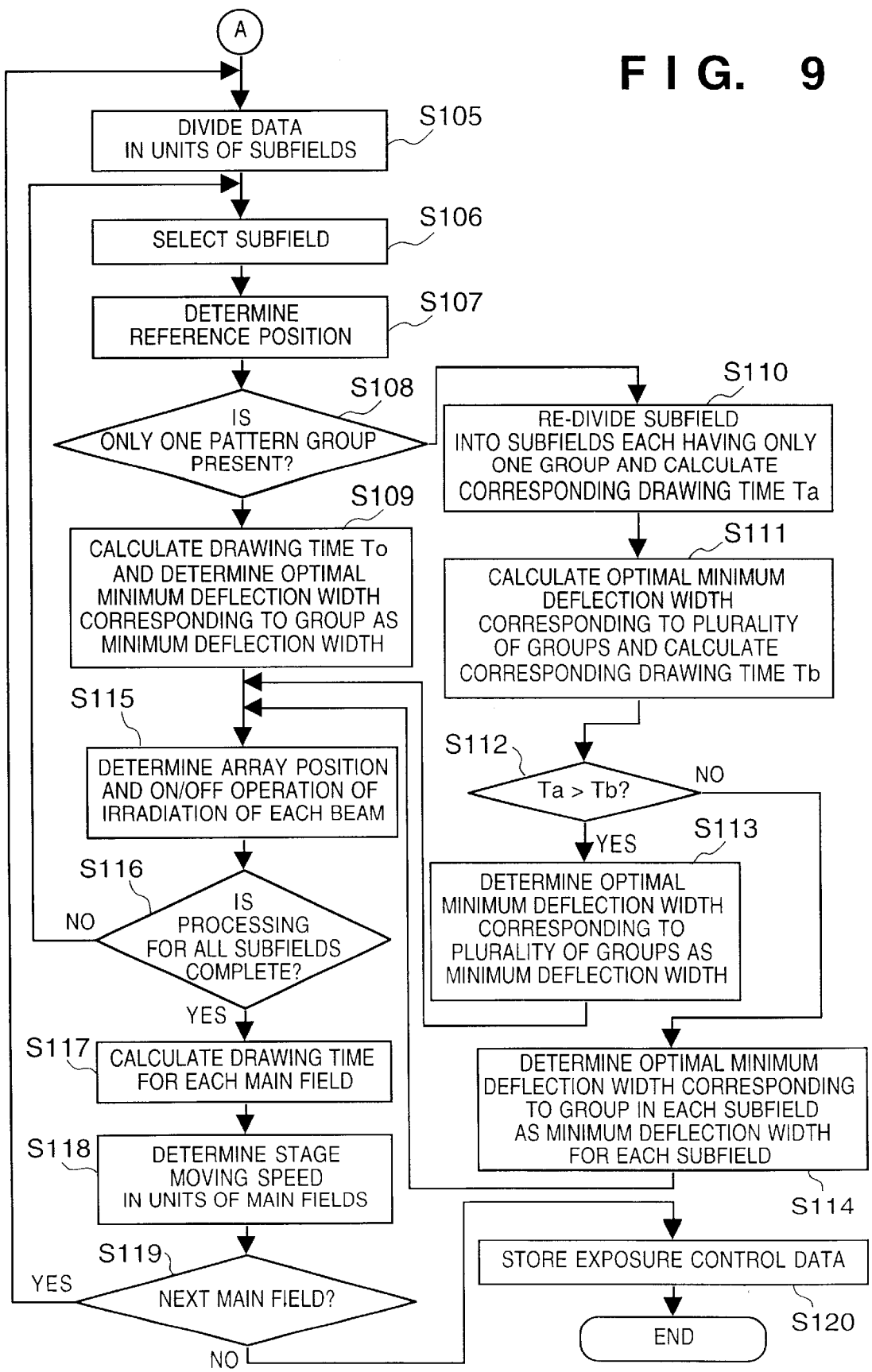
FIG. 9 is a flow chart for explaining exposure control data creation processing.

Upon reception of drawing data (bitmap data) for forming a pattern on a wafer by exposure, the CPU 25 executes a procedure for creating exposure control data, as shown in FIGS. 8 and 9.

Each step will be described below.

(Step S101): As shown in FIG. 1A, pattern groups in the drawing data are classified into groups on the basis of the pattern sizes. In this embodiment, the patterns are formed into a plurality of groups on the basis of the design rules (minimum line widths) of the patterns.

(Step S102): The optimal minimum deflection width by which the sub-deflector 62 deflects an electron beam and the optimal electron beam diameter (the size of an electron source image formed on the wafer) are determined for each of the classified groups. In this embodiment, ¼ of the minimum line width of the pattern groups is determined as the minimum deflection width. In addition, the electron beam diameter is determined such that the diameter is approximately equal to the circumscribed circle of a square having a side equal to the minimum deflection width.

(Step S103): The input drawing data is divided into data in units of main fields determined by the electron beam exposure apparatus of this embodiment.

(Step S104): The first main field to be exposed in exposure is selected.

(Step S105): The drawing data for the selected main field is divided into data in units of subfields determined by the electron beam exposure apparatus of this embodiment.

(Step S106): One subfield is selected.

(Step S107): The deflection position (reference position) set by the main deflector 61 in exposing the selected subfield is determined.

(Step S108): The number of groups present in the selected subfield is checked. If only one group is present, the flow advances to step S109. Otherwise, the flow advances to step S110.

This step will be described in detail with reference to FIG. 1A. If both the pattern groups PG1 and PG2 present in the subfield SF0 are based on the design rule of 100 nm, the flow advances to step S109. If the pattern groups PG1 and PG2 present in the subfield SF0 are based on different design rules, the flow advances to step S110.

(Step S109): The optimal minimum deflection width corresponding to the only group present in the subfield is determined as the minimum deflection width of the sub-deflector 62, and the optimal electron beam diameter corresponding to the group is determined as the electron beam diameter set when a pattern is to be drawn in the target subfield. The number of times the sub-deflector 62 settles the position of an electron beam (the number of times of settling) in drawing a pattern in the subfield with the determined minimum deflection width is calculated. A drawing time To for drawing a pattern in the subfield is calculated on the basis of the number of times of settling and the time for settling the position of the electron beam.

(Step S110): The subfield in which a plurality of pattern groups are present is divided into subfields each including only one group. This step will be described in detail with reference to FIG. 1B. When the pattern groups PG1 and PG2 present in the subfield SF0 are based on different design rules, the subfield SF0 is divided into the subfields SF1 and SF2. The number of times the sub-deflector 62 settles the electron beam (the number of times of settling) in drawing with the optimal minimum deflection width corresponding to each divided subfield (the number of times of settling) is calculated. The drawing time required to draw a pattern in each subfield is calculated on the basis of the number of times of settling and the settling time for the electron beam. A drawing time Ta as the sum of drawing times for the respective divided subfields is calculated.

(Step S111): The optimal minimum deflection width corresponding to the plurality of groups in each subfield is calculated. More specifically, the greatest common divisor of the minimum line widths of the respective groups is calculated, and the greatest common divisor is set as the optimal minimum deflection width. The number of times the sub-deflector 62 settles the position of the electron beam (the number of times of settling) in drawing a pattern in the subfield with the optimal minimum deflection width is calculated, and a drawing time Tb required to draw a pattern in the subfield is calculated on the basis of the number of times of settling and the settling time for the electron beam.

(Step S112): The drawing time Ta is compared with the drawing time Tb. If the drawing time Ta is longer than the drawing time Tb, the flow advances to step S113. If the drawing time Tb is longer than the drawing time Ta, the flow advances to step S114. Assume that the pattern group PG1 is based on the design rule of 100 nm, and pattern group PG2 is based on the design rule of 180 nm, as shown in FIG. 1B. In this case, as described in association with the principle of the present invention, when the subfield SF0 is divided into the subfields SF1 and SF2, the number of times of settling the position of the electron beam is smaller than the drawing time Ta is longer than the drawing time Tb when the subfield SF0 is not divided. The flow therefore advances to step S114. Assume that the pattern group PG1 is based on the design rule of 100 nm, and the pattern group PG2 is based on the design rule of 120 nm. In this case, if the subfield SF0 is divided into the subfields SF1 and SF2, the minimum deflection width is set to 25 nm, and the irradiation of each electron beam except the electron beam located in the subfield SF1 is inhibited, thereby drawing the pattern group PG1 in the subfield SF1. Then, the minimum deflection width is set to 30 nm, and the irradiation of each electron beam except the electron beam corresponding to the element exposure area and located in the subfield SF2 is inhibited, thereby drawing the pattern group PG1 in the subfield SF1. In this case, the number of times of settling the position of the electron beam is 35,136. When a pattern is to be drawn in the subfield SF0, the minimum deflection width is set to 20 nm, which is the greatest common divisor of 100 nm and 120 nm. In this case, therefore, the number of times of settling the position of the electron beam is smaller and the drawing time Ta is longer than the drawing time Tb when the subfield SF0 is not divided into the subfields SF1 and SF2 than when the subfield SF0 is divided. The flow therefore advances to step S113.

(Step S113): The minimum deflection width of the subfield in which a plurality of pattern groups are present is determined as the optimal minimum deflection width corresponding to the plurality of groups, which is calculated in step S111, and the optimal electron beam diameter corresponding to the determined minimum deflection width is determined as the electron beam diameter with which a pattern is to be drawn in the subfield to be exposed.

(Step S114): The optimal minimum deflection width corresponding to the group in each divided subfield is determined as the minimum deflection width for each subfield, and the optimal electron beam diameter corresponding to the group in each divided subfield is determined as the electron beam diameter with which a pattern is to be drawn in the divided subfield to be exposed.

(Step S115): The drawing data for each element exposure area is divided in accordance with the determined minimum deflection width as an array interval, and the array interval of an array element to be exposed is determined. ON/OFF operation of the blanking electrode for each element electron optical system corresponding to the array position where the position of the electron beam is settled is determined. When the subfield is redivided, this operation is determined in units of subfields. In this case, the blanking electrode at the array position of the electron beam that is not used for drawing in the target subfield is turned off.

(Step 116): It is checked whether the processing in steps S107 and S115 is complete for all the subfields in the selected main field. If there is any subfield that has not been processed, the flow returns to step S106 to select an unprocessed subfield. If there is no unprocessed subfield, the flow advances to step S117.

(Step S117): The drawing times in the respective subfields in a selected main field MF(n) are added together to calculate a drawing time T(n) for the selected main field.

Figure 10A:
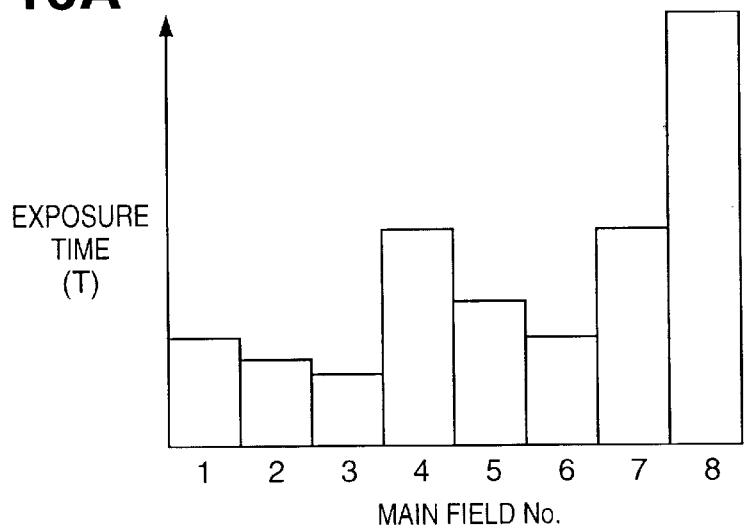
FIGS. 10A, 10B, and 10C are graphs for explaining the relationship between the exposure time for each main field and the moving speed of the stage.
Figure 10B:
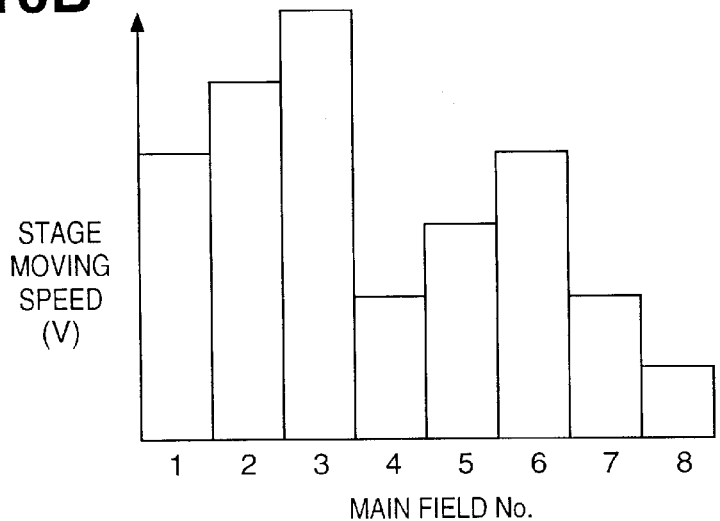

(Step S118): The moving speed of the stage in exposing each main field is determined on the basis of the exposure time calculated for each main field. FIG. 10A shows an example of the relationship between each main field MF(n) and the drawing time T(n). As shown in FIG. 10A, when at least one subfield of at least one main field is re-divided, and a pattern is drawn in each subfield while the minimum deflection width is changed, the drawing time may vary among main fields. In this embodiment, therefore, a stage moving speed V(n) inversely proportional to the exposure time is determined. For example, the length of each main field in the stage moving direction is 230.4 $\mu$m, if the exposure time T(n)=2.304 ms, stage moving speed V(n)= 100 mm/s(=LMF/T(n)). FIG. 10B shows the relationship between each main field and the stage moving speed. Since each main field is exposed at the stage moving speed determined for each main field in accordance with the exposure time for each main field, the wafer can be exposed in a shorter period of time. Assume that the stage is controlled at a constant speed, as in the conventional multi-electron beam exposure apparatus. In this case, when a main field demanding a short exposure time is exposed first and then the next main field is to be exposed, the processing must be interrupted until the next main field enters the deflection range of the main deflector 61. In contrast to this, the present invention does not require this interruption time.

(Step S119): If there is any main field to be exposed next in the exposure process, this main field is selected, and the flow returns to step S105. If there is no main field to be exposed next in the exposure process, the flow advances to step S117.

(Step S120): The processing is terminated after exposure control data like those shown in FIG. 11, i.e., the stage moving speed for each main field and the exposure control data for each subfield in each main field, are stored. In this case, as shown in FIG. 11, the contents of the exposure data for each subfield are data associated with the reference position determined by the main deflector 61, the number of re-divisions of the subfield, the minimum deflection width of the sub-deflector 62, which corresponds to the subfield, the electron beam diameter corresponding to the minimum deflection width, the array positions determined by the sub-deflector 62, and ON/OFF control of the irradiation of the electron beam from each element electron optical system at each array position.

In this embodiment, these processes are performed by the CPU 25 of the electron beam exposure apparatus. Even if the processes are performed in another processing unit, and the resultant exposure control data are transferred to the CPU 25, the same object and effects as described above can be attained.

<Description of Exposure Based on Exposure Control Data>

Figure 12:
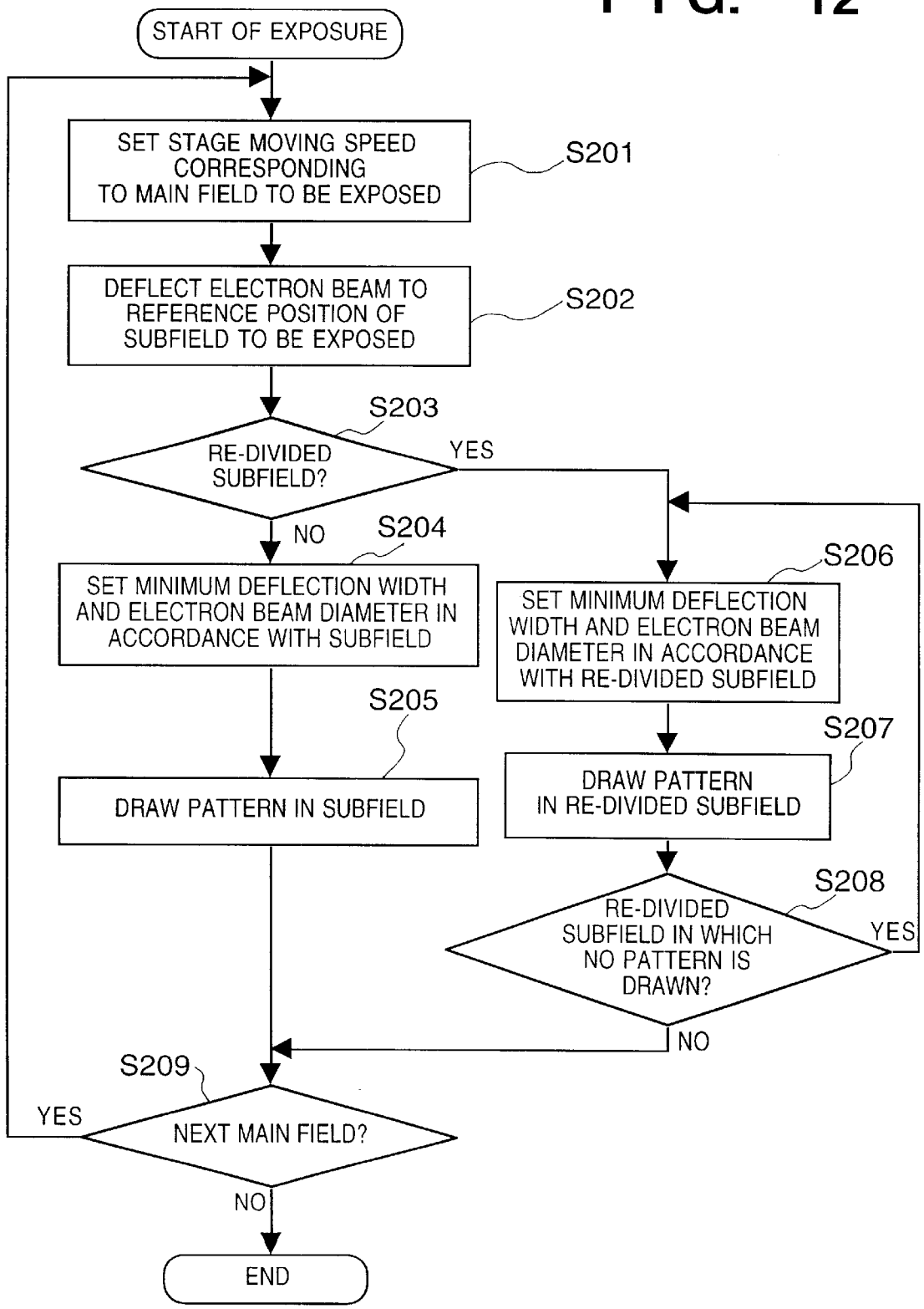
FIG. 12 is a flow chart for explaining exposure based on exposure control data.

When the CPU 25 instructs the control system 22 through the interface 24 to execute exposure, the control system 22 executes the steps in FIG. 12 on the basis of the exposure control data transferred and stored in the memory 23.

Each step will be described below.

(Step S201): The CPU 25 directs the stage drive control circuit 20 to control the X-Y stage 12 by switching to the stage moving speed corresponding to the main field to be exposed.

(Step S202): The CPU 25 directs the drawing deflection control circuit 17 to cause the main deflector 61 to deflect a plurality of electron beams from the plurality of element electron optical systems such that the electron beams are located at the reference positions in the subfield to be exposed.

(Step 203): It is checked whether there is any re-divided subfield. If there is no re-divided subfield, the flow advances to step S204. Otherwise, the flow advances to step S206.

(Step S204): The CPU 25 directs the drawing deflection control circuit 17 to set the minimum deflection width of the sub-deflector 62 to the minimum deflection width corresponding to the subfield in which a pattern is to be drawn. The CPU 25 further directs the focal length control circuit FC to change the focal length of the illumination electron optical system 2 so as to set the determined electron beam diameter.

(Step S205): The CPU 25 directs the drawing deflection control circuit 17 to cause the sub-deflector 62 to deflect a plurality of electron beams from the element electron optical system array with the set minimum deflection width as a unit to the deflection positions determined by the exposure control data. At the same time, the CPU 25 directs the blanking control circuit 14 to turn on/off the blanking electrode of each element electron optical system in accordance with the pattern to be formed on the wafer 5 by exposure, thereby drawing a pattern in the subfield. At this time, the X-Y stage 12 continuously moves in the X direction, and the drawing deflection control circuit 17 controls the deflection position of each electron beam, in addition to the movement amount of the X-Y stage 12.

(Step S206): The CPU 25 directs the drawing deflection control circuit 17 to set the minimum deflection width of the main deflector 61 to the minimum deflection width corresponding to the current re-divided subfield. The CPU 25 further directs the focal length control circuit FC to change the focal length of the illumination electron optical system 2 to set the determined electron beam diameter.

(Step S207): The CPU 25 directs the drawing deflection control circuit 17 to cause the sub-deflector 62 to deflect a plurality of electron beams from the element electron optical system array with the set minimum deflection width as a unit to the deflection positions determined by the exposure control data. At the same time, the CPU 25 directs the blanking control circuit 14 to turn on/off the blanking electrode of each element electron optical system in accordance with the pattern to be formed on the wafer 5 by exposure, thereby drawing a pattern in the current re-divided subfield. At this time, the X-Y stage 12 continuously moves in the X direction, and the drawing deflection control circuit 17 controls the deflection position of each electron beam, in addition to the movement amount of the X-Y stage 12.

(Step S208): It is checked whether there is any re-divided subfield in which no pattern is drawn. If there is no such subfield, the flow advances to step S209. Otherwise, the flow returns to step S206.

(Step S209): If there is any main field to be exposed next, the flow returns to step S201. Otherwise, the exposure processing is terminated.

<Second Embodiment>

In the first embodiment, to change the size of a point-like pattern to be formed on the wafer by each electron beam in accordance with the determined minimum deflection width, the electron beam diameter is changed. In this embodiment, the size of each point-like pattern is changed by changing the settling time (so-called exposure time) at the deflection position of each electron beam while fixing the electron beam diameter (the size of the electron beam formed into an image on the wafer). More specifically, when the minimum deflection width increases, the size of a point-like pattern is increased to prolong the settling time. In general, letting Ts be the settling time for an electron beam at the deflection position, and Tn be the time between the instant at which the electron beam is deflected and the instant at which the electron beam is settled at a desired deflection position, a deflection period Td of a sub-deflector 62 is given by Td=Ts+Tn. In this case, since Tn is essentially constant, the size of a point-like pattern is changed by changing the deflection period Td of the sub-deflector 62 in accordance with the determined minimum deflection width. Therefore, the deflection period Td of the sub-deflector 62 is determined on the basis of the determined minimum deflection width, the current density of the electron beam, the electron beam diameter, and the resist sensitivity. At this time, the size of the point-like pattern is set to be approximately equal to the circumscribed circle of a square having a side equal to the minimum deflection width. In addition, drawing times To, Ta, and Tb are calculated on the basis of this deflection period and the number of settling positions.

<Third Embodiment>

In the first embodiment, the stage moving speed for each main field is determined in inverse proportion to the exposure time required to expose each main field. If, however, there is a large difference between the moving speeds determined for main fields that neighbor in the continuously moving direction, an excessive acceleration acts on the stage. This makes it difficult to control the stage, and deteriorates the positional stability of the stage. In this embodiment, therefore, the moving speed for one of the main fields which demands a higher moving speed is set again to be lower than the determined moving speed such that the difference between the moving speeds determined for the main fields that neighbor the continuously moving direction is equal to or less than a predetermined value (Vp).

Figure 13:
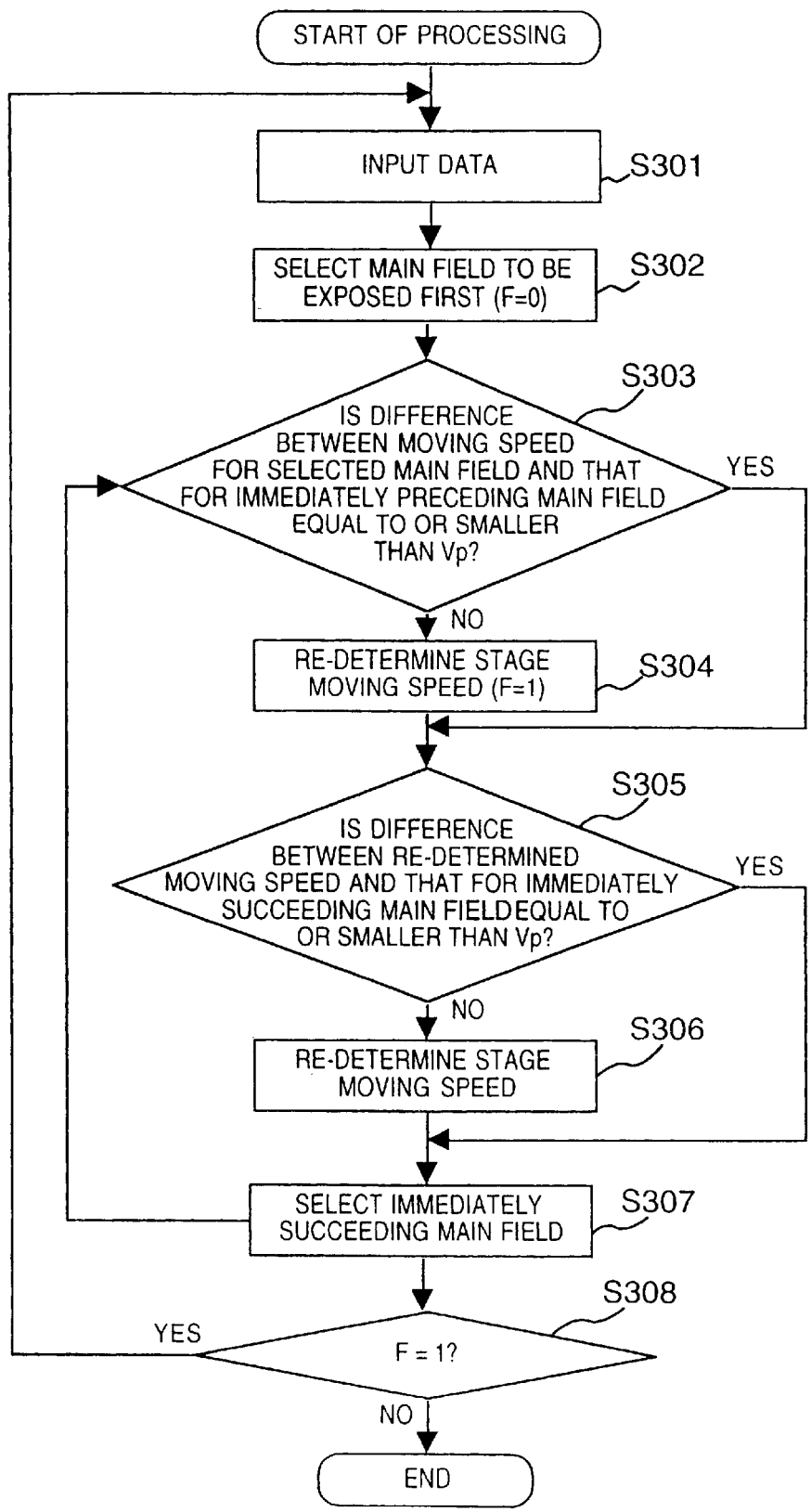
FIG. 13 is a flow chart for explaining a method of determining the stage moving speeds in units of main fields.

This processing will be described in detail with reference to FIG. 13.

(Step S301): Information about the relationship (FIG. 10B) between each main field and the stage moving speed, determined in the first embodiment, is input.

(Step S302): The first main field to be exposed in exposure is selected. A re-determination flag F is set as F=0.

(Step S303): The difference between the moving speed of the stage set for the selected main field and that set for the main field exposed immediately before the selected main field is exposed is calculated (in the absence of the immediately preceding main field, the flow jumps to step S305). If the difference is not equal to or smaller than the predetermined value that can ensure controllability and safety of the stage, the flow advances to step S304. If the difference is equal to or smaller than the predetermined value (Vp), the flow jumps to step S305.

(Step S304): The moving speed of the main field for which the higher moving speed is set is redetermined to be equal to or smaller than the predetermined value. The re-determination flag F is set to F=1.

(Step S305): The difference between the moving speed of the stage set for the selected main field and that set for the main field exposed immediately before the selected main field is exposed is calculated (in the absence of the immediately preceding main field, the flow jumps to step S305). If the difference is not equal to or smaller than the predetermined value that can ensure controllability and safety of the stage, the flow advances to step S306. If the difference is equal to or smaller than the predetermined value (Vp), the flow jumps to step S307.

(Step S306): The moving speed of the main field for which the higher moving speed is set is re-determined to be equal to or smaller than the predetermined value.

(Step S307): The main field to be exposed immediately before the selected main field is exposed is selected, and the flow returns to step S303. If there is no immediately preceding main field, the flow advances to step S308.

(Step S308): If the re-determination flag F is set to F=1, the flow returns to step S302. If the re-determination flag F is set to F=0, the processing is terminated.

Figure 10C:
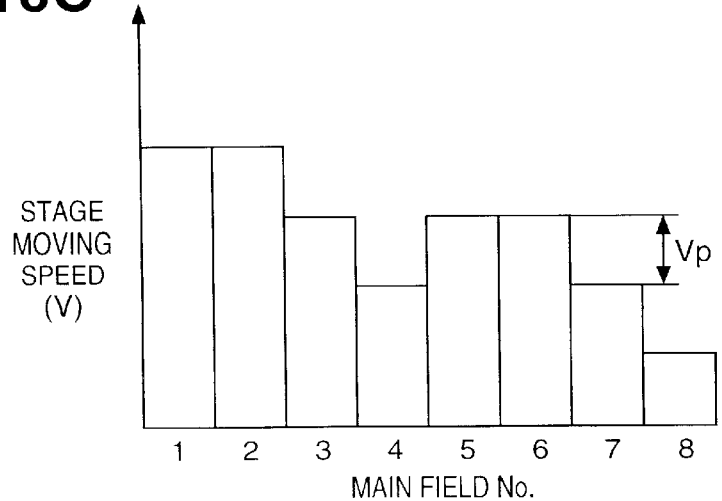

FIG. 10C shows the result obtained by the above processing, i.e., the relationship between each main field and the stage moving speed which is determined in the first embodiment.

<Fourth Embodiment>

Figure 14:
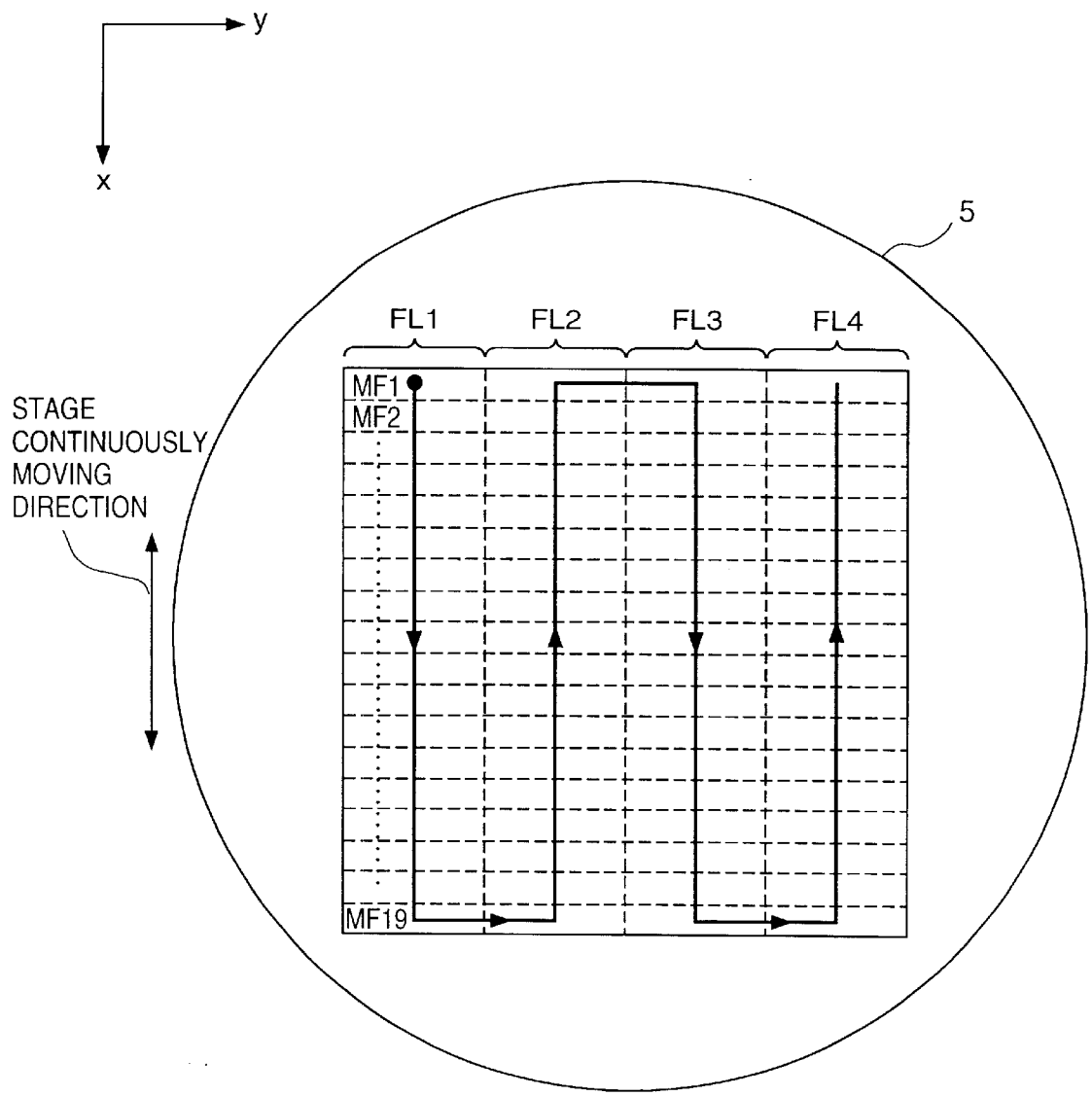
FIG. 14 is a view for explaining frames.

In this embodiment, as shown in FIG. 14, after a frame FL1 consisting of a plurality of main fields as exposure areas arrayed on a wafer 5 in the continuously moving direction is exposed, a stage 12 is stepped in the Y direction, and the continuously moving direction of the stage 12 is reversed to expose a next frame FL2. That is, the frames aligned in a direction perpendicular to the continuously moving direction of the stage 12 are sequentially exposed.

In the first embodiment, the moving speed of the stage is determined in units of main fields. In this embodiment, the moving speed of the stage is determined in units of frames. More specifically, the stage moving speed for each frame is determined on the basis of the exposure time for one of the main fields constituting the frame for which the longest exposure time is set. When the frame in which drawing is to be performed changes, the moving speed of the X-Y stage is switched to the determined moving speed, and drawing progresses at the same stage moving speed within the frame.

<Example of Device Manufacturing Method>

An embodiment of the device manufacturing method using the above-described electron beam exposure apparatus will be described below.

Figure 15:
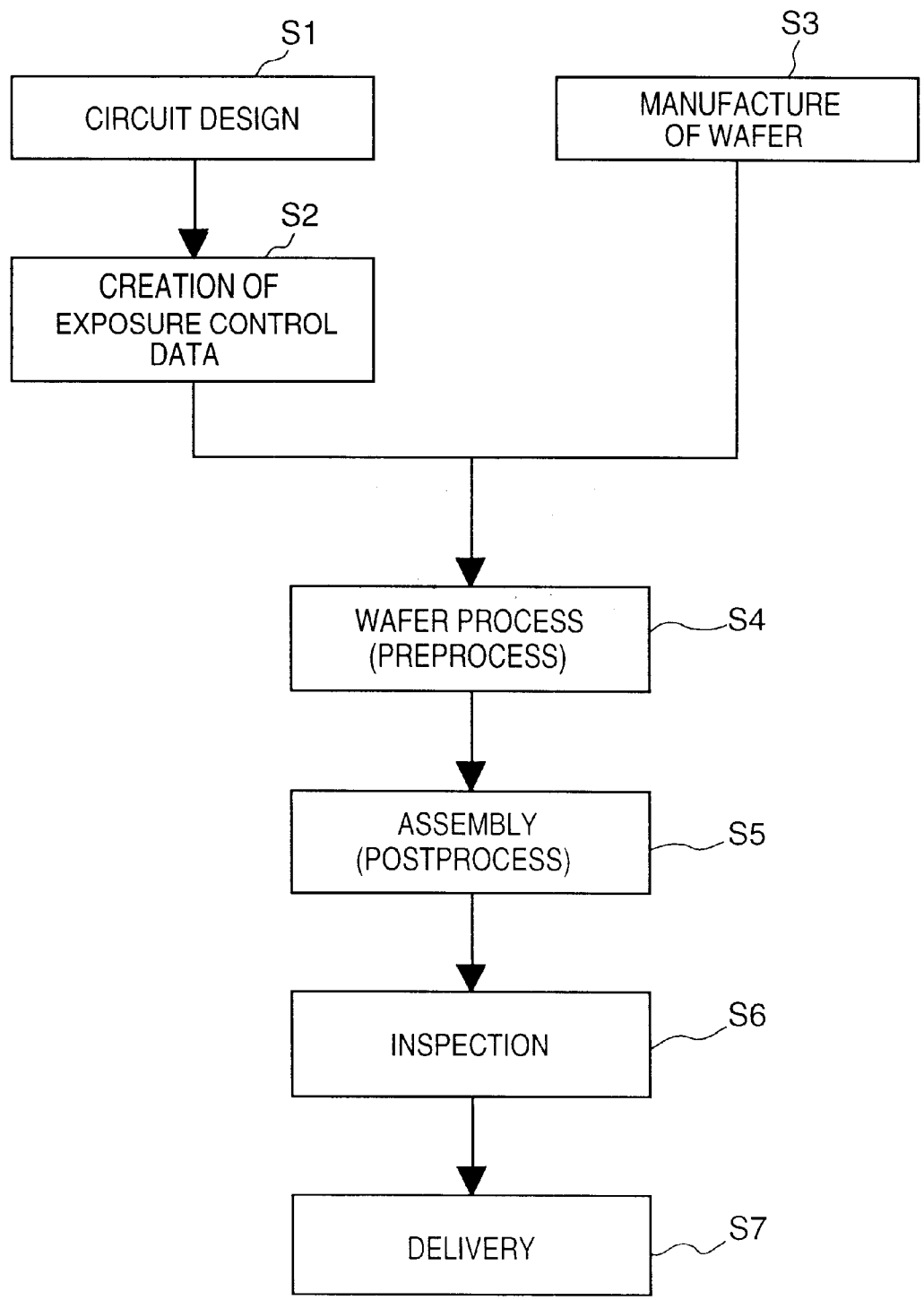
FIG. 15 is a flow chart for explaining the manufacture of a microdevice.

FIG. 15 is a flow chart showing the manufacture of a microdevice (a semiconductor chip such as an IC or LSI, a liquid crystal panel, a CCD, a thin-film magnetic head, a micromachine, or the like). In step 1 (circuit design), the circuit of a semiconductor device is designed. In step 2 (creation of exposure control data), exposure control data for the exposure apparatus is created on the basis of the designed circuit pattern. In step 3 (manufacture of wafer), a wafer is manufactured using a material such as silicon. Step 4 (wafer process) is called a preprocess in which the exposure apparatus to which the created exposure control data is input and the wafer are used to form an actual circuit on the wafer by lithography. Step 5 (assembly) is called a postprocess in which semiconductor chips are formed from the wafer manufactured in step 4. The postprocess includes an assembly process (dicing and bonding) and packaging process (chip encapsulating). In step 6 (inspection), the operation confirmation test, durability test, and the like are performed for the semiconductor device manufactured in step 5. With these processes, a semiconductor device is completed and delivered (step 7).

Figure 16:
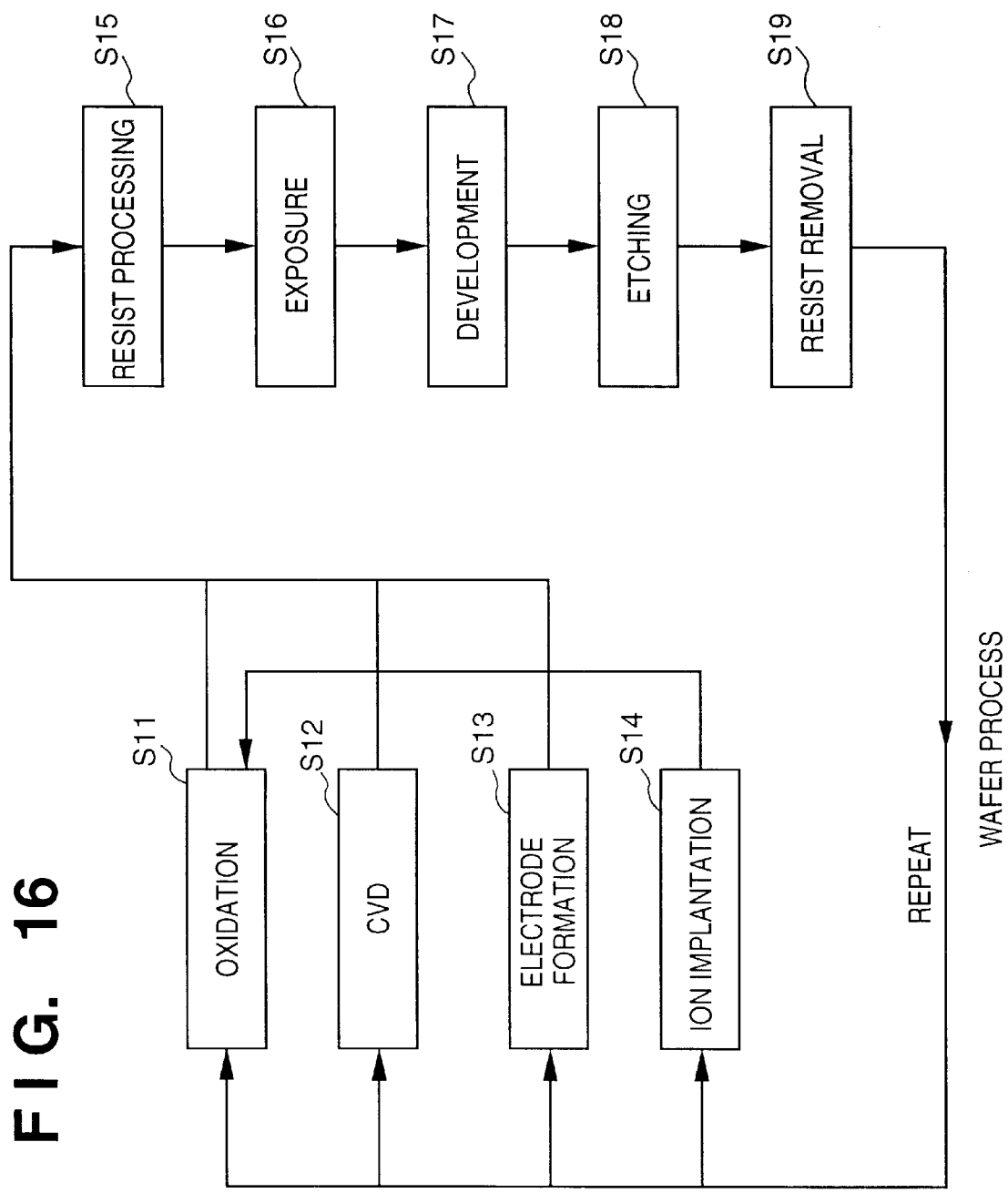
FIG. 16 is a flow chart for explaining a wafer process.
Figure 17:
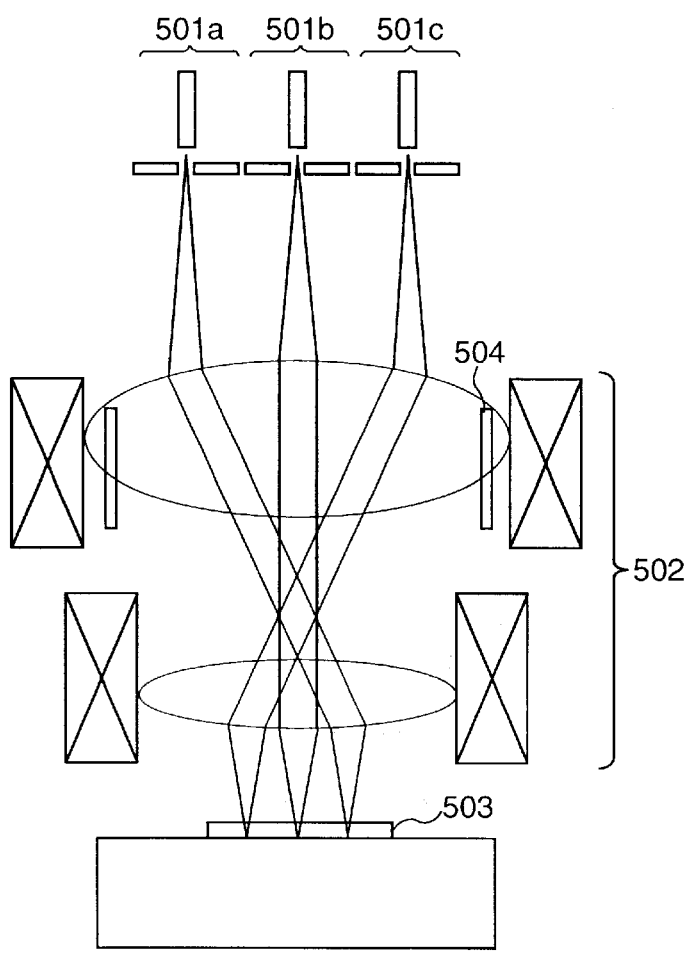
FIGS. 17, 18, 19, and 20 are views for explaining a conventional multi-electron beam exposure apparatus.
Figure 18:
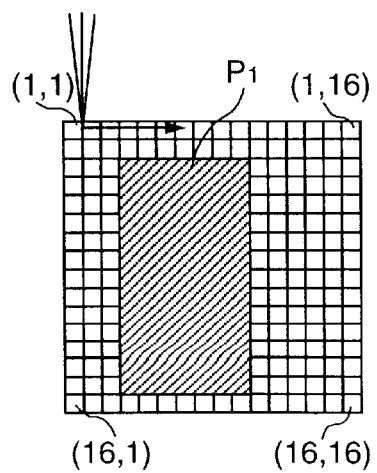
Figure 19:
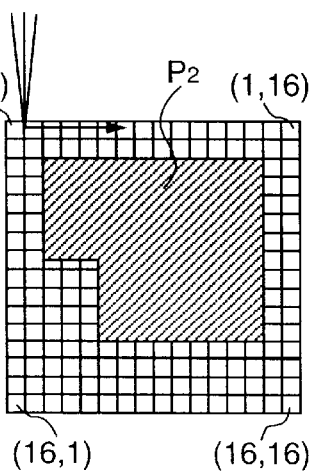
Figure 20:
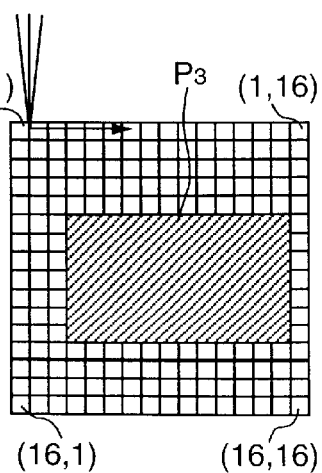

FIG. 16 is a flow chart showing the wafer process in detail. In step 11 (oxidation), the surface of the wafer is oxidized. In step 12 (CVD), an insulating film is formed on the surface of the wafer. In step 13 (electrode formation), an electrode is formed on the wafer by deposition. In step 14 (ion implantation), ions are implanted in the wafer. In step 15 (resist processing), a photosensitive agent is applied on the wafer. In step 16 (exposure), the circuit pattern is formed on the wafer by exposure using the above-described exposure apparatus. In step 17 (development), the exposed wafer is developed. In step 18 (etching), portions other than the developed resist image are etched. In step 19 (resist removal), the unnecessary resist after etching is removed. By repeating these processes, multiple circuit patterns are formed on the wafer.

When the manufacturing method of this embodiment is used, a high-integration semiconductor device which is conventionally difficult to manufacture can be manufactured at a low cost.

As has been described above, there is provided a multi-electron beam exposure method and apparatus which can suppress any increase in the amount of data for drawing even if drawing patterns include a fractional pattern. The method and apparatus of the present invention can manufacture a device with a higher precision than the prior art.

As many apparently widely different embodiments of the present invention can be made without departing from the spirit and scope thereof, it is to be understood that the invention is not limited to the specific embodiments thereof except as defined in the appended claims.

What is claimed is:

1. A multi-electron beam exposure method of simultaneously drawing in a plurality of areas of a surface to be exposed by using a plurality of electron beams, comprising classifying drawing patterns into a plurality of groups in accordance with design rules, and drawing while changing a minimum deflection width of each electron beam in units of groups.

2. The method according to claim 1, wherein drawing is sequentially performed in the respective areas of the plurality of groups.

3. The method according to claim 1, wherein a diameter of each electron beam or a settling time therefor is changed in accordance with switching of the minimum deflection width.

4. A multi-electron beam exposure method of deflecting a plurality of electron beams onto a surface to be exposed of an object with a minimum deflection width as a unit on the basis of drawing data, independently controlling irradiation of each electron beam for each deflecting operation, and drawing a pattern in an element exposure area in units of electron beams, thereby drawing in a subfield consisting of the plurality of element exposure areas and sequentially drawing in a plurality of subfields, comprising:

the step of classifying pattern groups in the drawing data into a plurality of groups on the basis of design rules, and determining an optimal minimum deflection width for each group in drawing each pattern group;

the first dividing step of dividing the drawing data in units of the subfields;

the second dividing step of dividing a subfield having a plurality of pattern groups into subfields each having only one pattern group; and the step of, in exposing a subfield having only one pattern group, switching the minimum deflection width to an optimal minimum deflection width corresponding to the group, and deflecting the plurality of electron beams with the optimal minimum deflection width as a unit, thereby drawing a pattern.

5. The method according to claim 4, wherein the second dividing step comprises the step of comparing a drawing time required when the subfield is divided into subfields each having only one pattern group and drawing is sequentially performed in the respective subfields with an optimal minimum deflection width corresponding to the group in each subfield as a unit, with a drawing time required when the drawing is performed in the subfield before a dividing operation with an optimal minimum deflection width corresponding to a plurality of groups belonging to the subfield as a unit, thereby determining whether to divide the subfield into subfields each having only one pattern group.

6. The method according to claim 5, wherein the optimal minimum deflection width corresponding to the plurality of groups is a greatest common divisor of minimum deflection widths of the respective groups.

7. The method according to claim 4, further comprising the step of switching the diameters of the plurality of electron beams in accordance with switching of the minimum deflection widths in exposing each subfield.

8. The method according to claim 4, further comprising the step of switching the settling times for the plurality of electron beams in accordance with switching of the minimum deflection widths in exposing each subfield.

9. A device manufacturing method comprising a manufacturing step including the step of drawing a pattern using the method defined in claim 1.

10. A device manufacturing method comprising a manufacturing step including the step of drawing a pattern using the method defined in claim 4.

* * * * *